United States Patent
Hegele et al.

(10) Patent No.: US 9,947,504 B2
(45) Date of Patent: Apr. 17, 2018

(54) PARTICLE BEAM APPARATUS AND METHOD FOR OPERATING A PARTICLE BEAM APPARATUS

(71) Applicant: Carl Zeiss Microscopy GmbH, Jena (DE)

(72) Inventors: Klaus Hegele, Aalen (DE); Edgar Fichter, Unterkochen (DE); Michel Aliman, Oberkochen (DE); Dirk Preikszas, Oberkochen (DE); Christian Hendrich, Westhausen (DE); Momme Mommsen, Oberkochen (DE); Michael Schnell, Rechberghausen (DE); Kai Schubert, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/180,735

(22) Filed: Jun. 13, 2016

(65) Prior Publication Data

US 2017/0236683 A1  Aug. 17, 2017

(30) Foreign Application Priority Data

Jun. 15, 2015  (DE) .................. 10 2015 210 941

(51) Int. Cl.
  *H01J 37/24* (2006.01)
  *H01J 37/28* (2006.01)
  (Continued)

(52) U.S. Cl.
  CPC ........ *H01J 37/1477* (2013.01); *H01J 37/141* (2013.01); *H01J 37/21* (2013.01);
  (Continued)

(58) Field of Classification Search
  CPC ........ H01J 37/1477; H01J 37/24; H01J 37/28; H01J 37/3007; H01J 2237/103; H01J 2237/151; H01J 2237/152
  (Continued)

(56) References Cited

U.S. PATENT DOCUMENTS 3,644,700 A  2/1972  Kruppa et al.
3,749,964 A  7/1973  Hirata
(Continued)

FOREIGN PATENT DOCUMENTS

DE  20 56 620 A  11/1970
DE  20 63 598 A  12/1970
(Continued)

*Primary Examiner* — Nicole Ippolito
(74) *Attorney, Agent, or Firm* — Muirhead and Saturnelli, LLC

(57) ABSTRACT

The system described herein relates to a particle beam apparatus for analyzing and/or for processing an object and to a method for operating a particle beam apparatus. The particle beam apparatus is designed for example as an electron beam apparatus and/or an ion beam apparatus. The particle beam apparatus comprises a beam deflection device, for example an objective lens, which is provided with a first coil and a second coil. The first coil is operated with a first coil current. The second coil is operated with a second coil current. The first coil current and/or the second coil current may always be controlled in such a way that the sum of the first coil current and the second coil current (the summation current) or the difference between the first coil current and the second coil current (the difference current) is controlled to a setpoint value.

20 Claims, 14 Drawing Sheets

(51) Int. Cl.
  *H01J 37/147* (2006.01)
  *H01J 37/30* (2006.01)
  *H01J 37/141* (2006.01)
  *H01J 37/21* (2006.01)
  *H01J 37/26* (2006.01)

(52) U.S. Cl.
  CPC ............ *H01J 37/24* (2013.01); *H01J 37/265* (2013.01); *H01J 37/28* (2013.01); *H01J 37/3007* (2013.01); *H01J 2237/103* (2013.01); *H01J 2237/151* (2013.01); *H01J 2237/152* (2013.01)

(58) Field of Classification Search
  USPC ...... 250/396 R, 397, 306, 307, 492.1, 492.2, 250/492.3
  See application file for complete search history.

(56) References Cited

U.S. PATENT DOCUMENTS

| | | | |
|---|---|---|---|
| 6,140,642 A | 10/2000 | Kaneyama et al. | |
| 7,435,957 B2 | 10/2008 | Inada et al. | |
| 7,898,447 B2 | 3/2011 | Goshima et al. | |
| 8,314,409 B2 | 11/2012 | Miller et al. | |
| 2004/0179321 A1* | 9/2004 | Woo | H04N 9/29 361/150 |
| 2006/0043311 A1* | 3/2006 | Dean | H01J 37/141 250/396 ML |
| 2007/0121249 A1* | 5/2007 | Parker | G01R 33/04 360/123.1 |
| 2009/0238593 A1* | 9/2009 | Kinouchi | G03G 15/2042 399/67 |
| 2013/0257422 A1* | 10/2013 | Koike | G01R 33/093 324/225 |
| 2015/0338629 A1 | 11/2015 | Sieper et al. | |
| 2016/0156174 A1* | 6/2016 | Kirby | H01F 6/02 361/19 |

FOREIGN PATENT DOCUMENTS

| | | |
|---|---|---|
| DE | 198 38 211 A1 | 2/2000 |
| DE | 10 2010 006 052 A1 | 1/2011 |
| DE | 10 2012 210 905 A1 | 1/2014 |
| EP | 1 388 882 A2 | 2/2004 |

* cited by examiner $A = (E1-E2) - (E3-E4)$ $A = (E1-E2) + (E3-E4)$

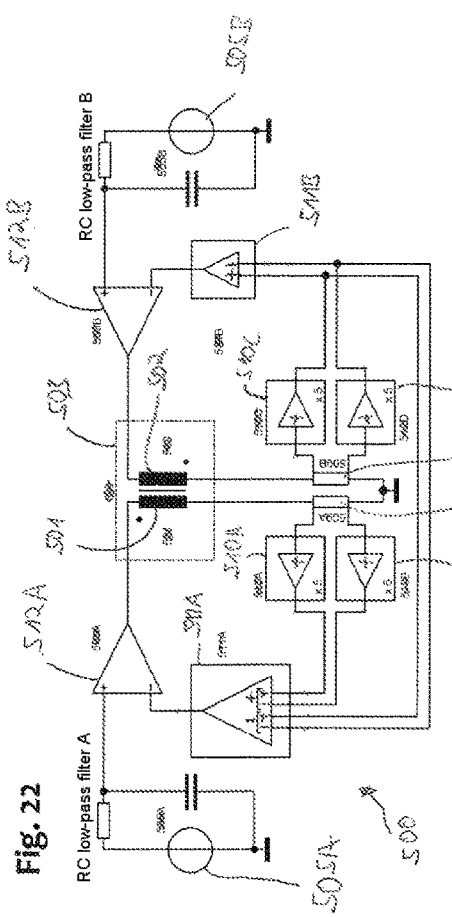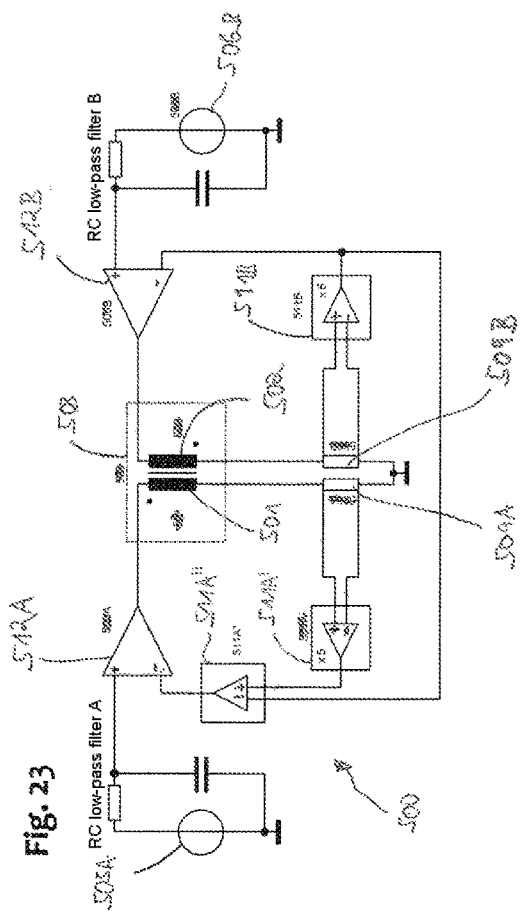
Fig. 22
Fig. 23

PARTICLE BEAM APPARATUS AND METHOD FOR OPERATING A PARTICLE BEAM APPARATUS

TECHNICAL FIELD

The system described herein relates to a particle beam apparatus for analyzing and/or for processing an object and to a method for operating a particle beam apparatus and more particularly to a particle beam apparatus designed as an electron beam apparatus and/or an ion beam apparatus.

BACKGROUND

Electron beam apparatuses, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and focused on an object to be examined by way of a beam guiding system. An objective lens is used for focusing purposes, and said objective lens will be discussed in greater detail further below. The primary electron beam is guided in a raster manner over the surface of the object to be examined by way of a deflection device. Here, the electrons of the primary electron beam interact with the object to be examined. Interaction particles and/or interaction radiation is/are produced as a result of the interaction. By way of example, the interaction particles are electrons. In particular, electrons are emitted by the object—the so-called secondary electrons—and electrons of the primary electron beam are scattered back—the so-called backscattered electrons. The secondary electrons and backscattered electrons are detected by means of at least one particle detector. The particle detector generates detection signals, which are used to generate an image of the object. Thus, an image of the object to be examined is obtained. By way of example, the interaction radiation comprises x-ray radiation and/or cathodoluminescence radiation. The interaction radiation is detected by means of at least one radiation detector, which generates detection signals. By way of example, these detection signals are used to generate spectra, by means of which properties of the object to be examined are determined.

In a TEM, a primary electron beam is likewise generated by means of a beam generator and focused on an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system having an objective. By way of example, the aforementioned system additionally also comprises a projection lens. Here, imaging can also take place in the scanning mode of a TEM. Such a TEM is generally referred to as STEM. Additionally, provision can be made for detecting electrons scattered back at the object to be examined and/or secondary electrons emitted by the object to be examined by means of a further detector in order to image an object to be examined.

The integration of the function of an STEM and an SEM in a single particle beam apparatus is known. It is therefore possible to carry out examinations of objects with an SEM function and/or with an STEM function using this particle beam apparatus.

Furthermore, the prior art has disclosed the practice of analyzing and/or processing an object in a particle beam apparatus using, on the one hand, electrons and, on the other hand, ions. By way of example, an electron beam column having the function of an SEM is arranged at the particle beam apparatus. Additionally, an ion beam column is arranged at the particle beam apparatus. Ions used for processing an object are generated by means of an ion beam generator arranged in the ion beam column. By way of example, material of the object is ablated or material is applied onto the object during the processing. The ions are additionally or alternatively used for imaging. The electron beam column with the SEM function serves, in particular, for examining the object, but also for processing the object.

In all of the above-described embodiments of a particle beam apparatus, in general use is made of an objective lens comprising pole pieces in which one coil is arranged or a plurality of coils are arranged. In particular, it is known to provide an objective lens with a first coil and with a second coil. The first coil and the second coil are wound for example onto an individual coil carrier. To put it more precisely, a first coil wire of the first coil and a second coil wire of the second coil are wound onto the individual coil carrier. For example, the first coil wire and the second coil wire are wound on one another. As an alternative thereto, provision is made for guiding the first coil wire and the second coil wire in a bifilar fashion. This means that the first coil wire and the second coil wire are wound closely alongside one another and parallel to one another around the individual coil carrier. The individual coil carrier may have a cavity through which a cooling liquid flows in order to achieve a cooling of the first coil and of the second coil.

The first coil and the second coil are supplied with a respective coil current by different current sources. This means that a first current source provides a first coil current for the first coil. Furthermore, a second current source provides a second coil current for the second coil. In order to control the first coil current to a specific value, a first current control unit is provided in the known particle beam apparatuses. Furthermore, a second current control unit is provided in order to control the second coil current to a specific value. In the known particle beam apparatuses provision is made for always controlling separately the first coil current, on the one hand, and the second coil current, on the other hand. In order to determine the individual currents, that is to say the first coil current and the second coil current, measuring resistors are provided in the current control devices. To put it more precisely, provision is made of a first measuring resistor for determining the first coil current and a second measuring resistor for determining the second coil current. A first through-flow current is determined by determining a voltage drop across the first measuring resistor. A second through-flow current is determined by determining a voltage drop across the second measuring resistor. It may happen here that a drift of the resistance value of the first measuring resistor and of the second measuring resistor may occur on account of heating of the first measuring resistor and of the second measuring resistor. Said drift may be different for the first measuring resistor and the second measuring resistor. This leads to different measurement errors when determining the individual through-flow currents and ultimately to erroneous control of the first coil current and/or of the second coil current.

Furthermore, provision is made for performing a so-called power-constant driving of the objective lens in the known particle beam apparatuses. This means that the power that is generated by the objective lens is intended always to be constant. To put it another way, the following is intended to hold true: $P=I_1^2 \cdot R_1 + I_2^2 \cdot R_2 = K$, wherein P is the power of the objective lens, $I_1$ is the first coil current, $I_2$ is the second coil current, $R_1$ is a first resistance, $R_2$ is a second resistance, and K is a constant. The abovementioned resistances are the resistances of the first coil and of the second coil. As an alternative thereto, they may also be the resistances of the measuring resistors used. For simplification it is assumed that the coils of the objective lens behave like ohmic resistors. As a result of the driving with a constant power, however, in the first coil and in the second coil an increase in the temperature occurs which is not compensated for by the abovementioned cooling with the cooling liquid. The temperature is accordingly not reduced again. The increase in the temperature of the first coil and/or of the second coil brings about a thermal expansion of the first coil, of the second coil and/or of the pole pieces. This thermal expansion may result in mechanical alterations of the first coil, of the second coil and/or of the pole pieces in such a way that fields generated by the first coil, the second coil and/or the pole pieces change. This may influence the focusing of the particle beam by the objective lens. In particular, inaccuracies in the focusing of the particle beam may occur.

The circuit arrangements for controlling the coil currents as known heretofore from the prior art have relatively high noise, which may lead to inaccuracies in the control of the coil currents.

Accordingly, it is desirable to be able to provide a particle beam apparatus and a method for operating a particle beam apparatus with which low-noise control of the current for the coils of an objective lens is possible, such that the focusing of a particle beam is influenced as little as possible.

SUMMARY OF THE INVENTION

The particle beam apparatus according to the system described herein is provided for analyzing an object and/or for processing an object. The particle beam apparatus comprises at least one beam generator for generating a particle beam with charged particles. By way of example, the charged particles are electrons or ions. Furthermore, the particle beam apparatus according to the system described herein is provided with at least one beam deflection device for deflecting the particle beam. By way of example, the beam deflection device is designed as an objective lens for focusing the particle beam onto the object. The beam deflection device has at least one first coil and at least one second coil. Furthermore, the particle beam apparatus comprises a circuit arrangement for providing a first coil current for the first coil and for providing a second coil current for the second coil. The particle beam apparatus according to the system described herein comprises at least one detector for detecting interaction particles and/or interaction radiation. The interaction particles and/or the interaction radiation arise/arises due to an interaction of the particle beam with the object. By way of example, the interaction particles are designed as secondary particles, for example secondary electrons, and/or backscattered particles, for example backscattered electrons. By way of example, x-ray radiation and/or cathodoluminescence radiation arise(s) as interaction radiation.

The circuit arrangement of the particle beam apparatus according to the system described herein has a first circuit unit for providing the first coil current and a second circuit unit for providing the second coil current. The first circuit unit is provided with a first setpoint value predefinition unit for predefining a first value in the form of a summation current of the first coil current and the second coil current or for predefining a first value in the form of a difference current from the first coil current and the second coil current. Furthermore, the first circuit unit has a first current control unit, wherein the first current control unit is connected to the first setpoint value predefinition unit and to the first coil. The first circuit unit furthermore has a first measuring resistor for determining a first through-flow current by measuring a first voltage, wherein the first measuring resistor is connected to the first coil.

The second circuit unit has a construction similar to the first circuit unit. In this regard, the second circuit unit has a second setpoint value predefinition unit for predefining a second value of the second coil current. The second circuit unit furthermore has a second current control unit, wherein the second current control unit is connected to the second setpoint value predefinition unit and to the second coil. The second circuit unit furthermore has a second measuring resistor for determining a second through-flow current by measuring a second voltage, wherein the second measuring resistor is connected to the second coil.

In the particle beam apparatus according to the system described herein, provision is now made for the first circuit unit to have at least one summation-difference unit, wherein the summation-difference unit is connected to the first measuring resistor and the second measuring resistor in such a way that it obtains the first voltage and the second voltage in each case as input signal. The summation-difference unit outputs a summation signal—that is to say a sum of the first voltage and the second voltage—or a difference signal—that is to say a difference between the first voltage and the second voltage—as output signal.

The summation-difference unit is connected to the first current control unit in such a way that the output signal of the summation-difference unit serves as input signal for the first current control unit for controlling the first coil current in such a way that the first value is achieved (is determined) in the form of the summation current of the first coil current and the second coil current or in the form of the difference current from the first coil current and the second coil current.

The system described herein is based on the consideration that in contrast to the prior art, which involves performing in each case a separate control of the first coil current and of the second coil current, now the first coil current and/or the second coil current can always be controlled in such a way that the sum of the first coil current and the second coil current (that is to say the summation current) or the difference between the first coil current and the second coil current (that is to say the difference current) is controlled to a setpoint value. Upon the predefinition of the summation current or of the difference current, the first setpoint value predefinition unit changes the flux or the excitation of the beam deflection device, for example of the objective lens. A desired power loss of the beam deflection device is set by means of the second setpoint value predefinition unit. Consequently, in the case of the system described herein, only a so-called reference variable, namely the chosen summation current or difference current, determines the magnetic flux. Only the noise of said reference variable influences the magnetic flux. Furthermore, an actual value of the summation current or of the difference current during the process of settling to the desired setpoint value deviates only slightly from the setpoint value if it only follows a reference variable.

It has been found that this enables a stable control of the current for the two coils of the beam deflection device, such that the deflection of the particle beam, for example a focusing of the particle beam, is influenced as little as possible particularly by noise. The noise of the circuit arrangement of the particle beam apparatus according to the system described herein is lower than the circuit arrangements known heretofore from the prior art for controlling the current for the two coils. This will be explained in more detail below.

The explanation is given on the basis of the example of a control of the summation current of the first coil current and the second coil current and a parallel winding sense of the first coil and the second coil. The same correspondingly holds true for the control of the difference current from the first coil current and the second coil current and with an antiparallel winding sense of the first coil and the second coil.

The beam deflection unit is excited by the first coil and the second coil, which have for example an identical number of turns. Each of the two aforementioned coils may generate a maximum partial excitation which may be higher than half of the maximum desired total excitation. The first setpoint value predefinition unit and the first current control unit are beset by noise. Both together generate the first coil current in the first coil, said first coil current having a first DC current component and a first AC current component. Furthermore, the second setpoint value predefinition unit and the second current control unit are also beset by noise. Both together generate the second coil current in the second coil, said second coil current having a second DC current component and a second AC current component. The polarity of the first coil and of the second coil and also the circuitry connection of the summation-difference unit are configured in such a way that when the second setpoint value predefinition unit is controlled in a suitable manner, the DC current component of the total excitation of the beam deflection unit may achieve the maximum desired value. The first current control unit, by means of the summation current measurement, may compensate for the AC current component in the second coil current by a corresponding AC current component in the first coil current. All that then remains is just the AC current component in the first coil current, which is generated directly in the first coil current by the noise in the first setpoint value predefinition unit and the first current control unit. However, this only acts on the first coil. That is to say on half of the number of turns. The noise that arises during the measurement at the second measuring resistor possibly owing to the use of amplifiers explained further below cannot be compensated for and acts on the first coil (with half the number of turns). However, the noise of the circuit arrangement overall becomes better than in the prior art.

The system described herein is not restricted to the use of two coils. Rather, any suitable number of coils may be used, for example N coils, wherein N is an integer. In this embodiment of the system described herein, it is then provided that the measured currents of the coils 2 to N are added to the measured current of the first coil in the control loop of the first coil (that is to say of the coil 1). In yet another embodiment, provision is made for using coils having different numbers of turns and for adding the measured currents to prefactors. By way of example, one coil with single number of turns and with single weighting and one coil with triple number of turns and triple weighting could be used instead of four coils.

In one embodiment of the particle beam apparatus according to the system described herein, provision is additionally or alternatively made for designing the first measuring resistor as a first shunt resistor. In addition or as an alternative thereto, provision is made for designing the second measuring resistor as a second shunt resistor. By way of example, provision is made for designing the first shunt resistor and/or the second shunt resistor in a 4-wire embodiment. To put it another way the first shunt resistor and/or the second shunt resistor have/has a four-conductor terminal, such that a four-conductor measurement is possible.

In yet another embodiment of the particle beam apparatus according to the system described herein, it is additionally or alternatively provided that the first measuring resistor and the second measuring resistor are arranged on an individual mounting unit in such a way that the first measuring resistor is thermally coupled to the second measuring resistor. The thermal coupling is effected for example in such a way that a first thermal resistance of the first measuring resistor with respect to the second measuring resistor is less than a second thermal resistance of the first measuring resistor and/or the second measuring resistor with respect to an environment of the first measuring resistor and/or of the second measuring resistor. By way of example the first thermal resistance is 2 times, 5 times, or 10 times less than the second thermal resistance. However, the system described herein is not restricted thereto. Rather, any suitable ratio of the first thermal resistance to the second thermal resistance is selectable. The environment may be a cooling device, for example. To put it another way, a thermal flux prevails between the first measuring resistor and the second measuring resistor in such a way that a temperature equalization between the two measuring resistors may be performed. This is because it may indeed be the case that different temperatures and thus different drifts in the resistance value may occur on account of a different loading of the first measuring resistor and of the second measuring resistor. The system described herein provides for the temperatures of the two measuring resistors to remain substantially constant on account of the thermal coupling of the first measuring resistor and the second measuring resistor. This has the advantage that it is possible to choose the resistance values of the two measuring resistors to be higher, in contrast to the prior art, without the abovementioned drifts increasing. High resistance values of the two measuring resistors significantly increase the signal-to-noise ratio of the circuit arrangement, such that the focusing of the particle beam is stable. By way of example, the first measuring resistor and the second measuring resistor in each case have a resistance value in the range of 1 ohm to 10 ohm. However, the system described herein is not restricted to these values. Rather, any suitable resistance value may be used. In particular, the first measuring resistor may be chosen in such a way that the voltage drop across the first measuring resistor is greater than 1 V or greater than 2 V, for example even greater than 5 V. Furthermore, the second measuring resistor may be chosen in such a way that the voltage drop across the second measuring resistor is greater than 1 V or greater than 2 V, for example even greater than 5 V.

In yet another embodiment of the particle beam apparatus according to the system described herein, it is additionally or alternatively provided that the second circuit unit has at least one difference unit, wherein the difference unit is connected to the second measuring resistor in such a way that it obtains the second voltage as input signal. Furthermore, the difference unit outputs a second difference signal as second output signal. Furthermore, it is provided that the difference unit is connected to the second current control unit for controlling the second coil current. In this case, the second coil current may be chosen for example in such a way that the power of the beam deflection device, for example of the objective lens, is substantially controlled to the desired second value.

In yet another exemplary embodiment of the particle beam apparatus according to the system described herein it is additionally or alternatively provided that at least one first preamplifier is connected between the first measuring resistor and the summation-difference unit.

By way of example, provision is made for connecting at least two first preamplifiers between the first measuring resistor and the summation-difference unit. To put it another way, the first preamplifier or the first preamplifiers is or are line-connected firstly to the first measuring resistor and secondly to the summation-difference unit. The first preamplifier or the first preamplifiers serve(s) to amplify the first voltage that is dropped across the first measuring resistor and is measured. The first preamplifier and the second preamplifier are chosen in such a way that their voltage noise is low and their input resistances are high. Fault voltages and leakage currents which are disturbing and may lead to faults are avoided as a result.

In a further embodiment of the particle beam apparatus according to the system described herein, it is additionally or alternatively provided that at least one second preamplifier is connected between the second measuring resistor and the summation-difference unit. In a further embodiment, it is provided that at least two second preamplifiers are connected between the second measuring resistor and the summation-difference unit. Furthermore, it is provided that the second preamplifier or the second preamplifiers is/are also connected between the second measuring resistor and the difference unit. All explanations regarding the abovementioned first preamplifier or the first preamplifiers also analogously hold true for the second preamplifier or the second preamplifiers.

In yet another embodiment of the particle beam apparatus according to the system described herein, it is additionally or alternatively provided that the first current control unit has a first operational amplifier and is connected to the summation-difference unit in such a way that the output signal of the summation-difference unit is an input signal of the first operational amplifier.

In yet another embodiment of the particle beam apparatus according to the system described herein, it is additionally or alternatively provided that the second current control unit has a second operational amplifier and is connected to the difference unit in such a way that the output signal of the difference unit is an input signal of the second operational amplifier.

In yet another exemplary embodiment of the particle beam apparatus according to the system described herein, it is provided that the summation-difference unit is designed as an externally connected operational amplifier and/or the difference unit is designed as an externally connected operational amplifier. In an alternative embodiment, provision is made for using, instead of an externally connected operational amplifier, a differential amplifier formed from at least one operational amplifier having internal circuitry connection.

In a further embodiment of the particle beam apparatus according to the system described herein, it is additionally or alternatively provided that the second current control unit for controlling the second coil current is configured in such a way that a power of the beam deflection device is constant. It has been found that this enables a stable control of the current for both coils of the beam deflection device, such that the deflection of the particle beam, for example a focusing of the particle beam, is influenced as little as possible by temperature-dependent faults.

In one embodiment of the particle beam apparatus according to the system described herein, it is additionally or alternatively provided that the beam deflection device has at least one magnetic sector.

In a further embodiment of the particle beam apparatus according to the system described herein, it is additionally or alternatively provided that the circuit arrangement has a switchable low-pass filter having a charging circuit, wherein the charging circuit has an operational amplifier, an amplifier, a first resistor, a second resistor, a first capacitor, a second capacitor and a switch unit. The first setpoint value predefinition unit is line-connected to the operational amplifier. Furthermore, the amplifier is line-connected to the switch unit via the first resistor. The first setpoint value predefinition unit in turn is connected to the second resistor. The second resistor is line-connected to the switch unit and to the first capacitor. Furthermore, the switch unit is line-connected to the second capacitor. The function of the switchable low-pass filter is explained in greater detail further below.

In yet another embodiment of the particle beam apparatus according to the system described herein, it is additionally or alternatively provided that the charging circuit has at least one of the following features:
  a first Zener diode and a second Zener diode, which are connected in series;
  the switch unit has a switching setting in which the first capacitor and the second capacitor are connected in parallel with one another; or
  the operational amplifier is line-connected to the amplifier, or the operational amplifier is integrated with the amplifier jointly in a power operational amplifier or in a precision operational amplifier.

The system described herein also relates to a method for operating a particle beam apparatus for analyzing and/or processing an object, for example a particle beam apparatus having at least one of the abovementioned features or a combination of at least two of the abovementioned features. The method according to the system described herein comprises steps which are explained in greater detail below. The first setpoint value predefinition unit predefines a first value in the form of the sum of the first coil current and the second coil current (that is to say the summation current of the first coil current and the second coil current) or in the form of the difference between the first coil current and the second coil current (that is to say the difference current from the first coil current and the second coil current). By way of example, the summation current or the difference current is set manually or automatically by means of the first setpoint value predefinition unit. Furthermore, a second value of the second coil current is predefined by means of the second setpoint value predefinition unit. Here, too, it is provided, for example, that the second value of the second coil current is set manually or automatically by means of the second setpoint value predefinition unit.

The method according to the system described herein now provides for the first voltage to be measured by means of the first measuring resistor. Furthermore, the second voltage is measured by means of the second measuring resistor. By measuring the first voltage it is possible to determine a first through-flow current. Since the first voltage is related to the first through-flow current, it is possible to determine the current actually flowing through the first coil (here the first through-flow current). By measuring the second voltage, it is possible to determine a second through-flow current. Since the second voltage is related to the second through-flow current, it is possible to determine the current actually flowing through the second coil (here the second through-flow current).

The first voltage and the second voltage are fed to the summation-difference unit. By means of the summation-difference unit, the sum of the first voltage and the second voltage is then formed and then output as output signal of the summation-difference unit. As an alternative thereto, it is provided that the difference between the first voltage and the second voltage is formed and is output as output signal of the summation-difference unit. The output signal of the summation-difference unit is fed to the first current control unit as input signal. The first coil current is then controlled in such a way that the summation current or the difference current is achieved. In particular, it is provided that the summation current or the difference current has the predefined first value.

In a further embodiment of the method according to the system described herein, it is provided that controlling the second coil current is effected in such a way that a power of the beam deflection device is constant.

In yet another embodiment of the method according to the system described herein, it is provided that the second voltage is fed to the difference unit as input signal. Furthermore, a difference signal is formed as output signal by means of the difference unit. The output signal of the difference unit is fed to the second current control unit as input signal. The second coil current is then controlled using the second current control unit in such a way that the second value is achieved.

In a further exemplary embodiment of the method according to the system described herein, it is additionally or alternatively provided that predefining the summation current and the difference current by means of the first setpoint value predefinition unit comprises the following step. Firstly, setting the summation current or the difference current to a third value is effected, said third value being greater than the desired first value of the summation current or of the difference current in the case of an increase in the summation current or the difference current. Additionally or alternatively it is provided that predefining the second value of the second coil current by means of the second setpoint value predefinition unit comprises setting the second coil current to a fourth value, which is greater than the second value of the second coil current in the case of an increase in the second coil current. The abovementioned embodiments are based on the consideration that the first coil and/or the second coil do(es) not react very rapidly to a current change. To put it another way, it may take some time to set the summation current or the difference current to the first value and/or to set the second coil current to the second value. Said time may be significantly shortened by firstly setting the summation current or difference current to a value (the third value), wherein the third value is greater in the case of an increase in the summation current or the difference current to the first value. This results in a ramplike setting of the first coil current, as a result of which the actual first value is reached more rapidly. Provision is then made, upon reaching or shortly before reaching the desired first value of the summation current or of the difference current, for stopping the ramplike setting by setting the first value. An analogous procedure is provided with regard to the second coil current.

The second coil current is firstly set to a value (the fourth value), wherein the fourth value is greater in the case of an increase in the second coil current to the second value. This results in a ramplike setting of the second coil current, as a result of which the actually desired second value of the second coil current is reached more rapidly. Provision is then made, upon reaching or shortly before reaching the desired second value of the second coil current, for stopping the ramplike setting by setting the setting value.

BRIEF DESCRIPTION OF DRAWINGS

Below, the system described herein is explained in more detail on the basis of exemplary embodiments by means of the figures. In the figures:

FIG. 22 shows a sixth embodiment of the circuit arrangement for providing coil currents;

FIG. 23 shows a seventh embodiment of the circuit arrangement for providing coil currents;

DETAILED DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein can be used in any particle beam apparatus, in particular in each electron beam apparatus and/or in each ion beam apparatus. The system described herein relates in particular to particle beam apparatuses comprising one magnetic particle-optical unit or a plurality of magnetic particle-optical units in which the magnetic field of the unit or of the units is generated by the currents of a plurality of coils. By way of example, the particle-optical unit is designed as a beam deflection device, in particular as an objective lens.

Figure 1:
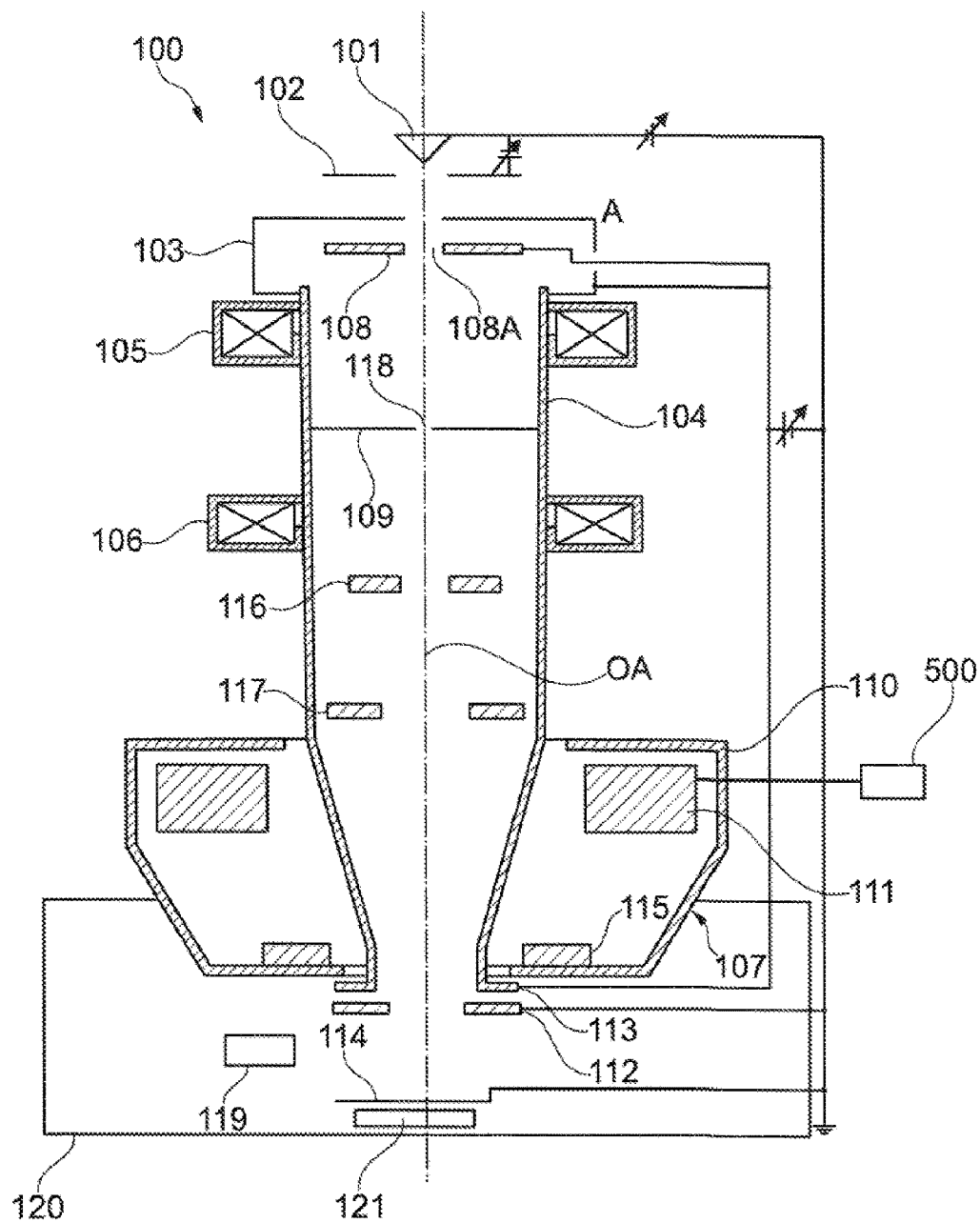
FIG. 1 shows a first embodiment of a particle beam apparatus according to the system described herein.

FIG. 1 shows a schematic illustration of an SEM 100. The SEM 100 has a first beam generator in the form of an electron source 101, which is embodied as a cathode. Furthermore, the SEM 100 is provided with an extraction electrode 102 and with an anode 103, which is placed onto one end of a beam guiding tube 104 of the SEM 100. By way of example, the electron source 101 is embodied as thermal field emitter. However, the system described herein is not restricted to such an electron source 101. Rather, any electron source is utilizable.

Electrons emerging from the electron source 101 form a primary electron beam. The electrons are accelerated to the anode potential due to a potential difference between the electron source 101 and the anode 103. In the exemplary embodiment depicted here, the anode potential is 1 kV to 20 kV, e.g. 5 kV to 15 kV, in particular 8 kV, in relation to a ground potential of a housing of a sample chamber 120. However, alternatively it could be at ground potential.

Two condenser lenses, namely a first condenser lens 105 and a second condenser lens 106, are arranged at the beam guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 is arranged between the anode 103 and the first condenser lens 105. Together with the anode 103 and the beam guiding tube 104, the first aperture unit 108 is at a high voltage potential, namely the potential of the anode 103, or it is connected to ground. The first aperture unit 108 has numerous first apertures 108A, of which one is depicted in FIG. 1. Two first apertures 108A suffice, however. Each one of the numerous first apertures 108A has a different aperture diameter. By means of an adjustment mechanism (not depicted here), it is possible to set a desired first aperture 108A onto an optical axis OA of the SEM 100. In a further embodiment, the first aperture unit 108 has only a single first aperture 108A. In this case, the adjustment mechanism may be absent, and the first aperture unit 108 is designed in a stationary fashion. A stationary second aperture unit 109 is arranged between the first condenser lens 105 and the second condenser lens 106. The second aperture unit 109 may also be designed in a movable fashion in further exemplary embodiments.

The first objective lens 107 has pole pieces 110, in which a bore is formed. The beam guiding tube 104 is guided through this bore. Furthermore, coils 111 are arranged in the pole pieces 110. This will still be discussed in more detail below.

An electrostatic retardation device is arranged in a lower region of the beam guiding tube 104. It has a single electrode 112 and a tube electrode 113. The tube electrode 113 is arranged at one end of the beam guiding tube 104, which faces an object 114. Together with the beam guiding tube 104, the tube electrode 113 is at the potential of the anode 103, while the single electrode 112 and the object 114 are at a lower potential in relation to the potential of the anode 103. In the present case, this is the ground potential of the housing of the sample chamber 120. In this manner, the electrons of the primary electron beam can be decelerated to a desired energy which is required for examining the object 114. However, the object 114 and the single electrode 112 can also be at different potentials and at potentials different from ground. As a result of this, it is possible, on the one hand, to displace the location of the retardation of the primary electrons; on the other hand, it is possible to influence the trajectories of the secondary electrons and the backscattered electrons, which will still be discussed below.

The SEM 100 furthermore has a scanning device 115, by means of which the primary electron beam can be deflected and scanned over the object 114. Here, the electrons of the primary electron beam interact with the object 114. As a result of the interaction, interaction particles and/or interaction radiation is/are produced, which is/are detected. In particular, electrons are emitted from the surface of the object 114—the so-called secondary electrons—or electrons of the primary electron beam are scattered back—the so-called backscattered electrons—as interaction particles.

A detector arrangement comprising a first detector 116 and a second detector 117 is arranged in the beam guiding tube 104 for detecting the secondary electrons and/or the backscattered electrons. Here, the first detector 116 is arranged on the source-side along the optical axis OA, while the second detector 117 is arranged on the object-side along the optical axis OA in the beam guiding tube 104. The first detector 116 and the second detector 117 are arranged offset from one another in the direction of the optical axis OA of the SEM 100. Both the first detector 116 and the second detector 117 each have a passage opening, through which the primary electron beam can pass. The first detector 116 and the second detector 117 are approximately at the potential of the anode 103 and of the beam guiding tube 104. The optical axis OA of the SEM 100 extends through the respective passage openings.

The second detector 117 serves principally for detecting secondary electrons. Upon emerging from the object 114, the secondary electrons initially have a low kinetic energy and arbitrary directions of motion. By means of the strong extraction field emanating from the tube electrode 113, the secondary electrons are accelerated in the direction of the first objective lens 107. The secondary electrons enter the first objective lens 107 approximately parallel. The beam diameter of the beam of secondary electrons remains small in the first objective lens 107 as well. The first objective lens 107 then has a strong effect on the secondary electrons and generates a comparatively short focus of the secondary electrons with sufficiently steep angles with respect to the optical axis OA, such that the secondary electrons diverge far apart from one another downstream of the focus and impinge on the second detector 117 on the active area thereof. By contrast, only a small proportion of electrons that are backscattered at the object 114—that is to say backscattered electrons—which have a relatively high kinetic energy in comparison with the secondary electrons upon emerging from the object 114, are detected by the second detector 117. The high kinetic energy and the angles of the backscattered electrons with respect to the optical axis OA upon emerging from the object 114 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the particle beam apparatus, the first detector 116 can be embodied, additionally or alternatively, with a grid electrode (not depicted here). The grid electrode is arranged at the side of the first detector 116 directed toward the object 114. With respect to the potential of the beam guiding tube 104, the grid electrode has such a negative potential that only backscattered electrons with a high energy are able to pass through the grid electrode to the first detector 116. Additionally or alternatively, the second detector 117 has a grid electrode, which has an analogous embodiment to the aforementioned grid electrode of the first detector 116 and which has an analogous function.

The detection signals generated by the first detector 116 and the second detector 117 are used to generate an image or images of the surface of the object 114. Reference is explicitly made to the fact that the apertures of the first aperture unit 108 and of the second aperture unit 109, as well as the passage openings of the first detector 116 and of the second detector 117 are depicted in exaggerated fashion. The passage opening of the first detector 116 and of the second detector 117 have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 is configured as a pinhole aperture in the exemplary embodiment depicted here and it is provided with a second aperture 118 for the passage of the primary electron beam, which has an extent in the range from 5 μm to 500 μm, e.g. 35 μm, perpendicular to the optical axis OA. In a further embodiment, the second aperture unit 109 is provided with a plurality of second apertures 118, which can be displaced mechanically with respect to the primary electron beam or which can be reached by the primary electron beam by the use of electrical and/or magnetic deflection elements. The second aperture unit 109 is embodied as a pressure stage aperture. It separates a first region, in which the electron source 101 is arranged and in which an ultra-high vacuum ($10^{-6}$ Pa to $10^{-10}$ Pa) prevails, from a second region, which has a high vacuum ($10^{-1}$ Pa to $10^{-5}$ Pa). The second region is the intermediate pressure region of the beam guiding tube 104, which leads to the sample chamber 120.

In addition to image generation, further examination methods can be carried out using the SEM 100. These include the so-called EBSD ("electron backscattered diffraction") method, in which diffraction patterns of scattered electrons are established. A further examination method is based on the detection of cathodoluminescence light, which emerges from the object 114 when the primary electron beam is incident on the object 114. Further examination methods include, for example, the examination by means of energy-dispersive x-ray spectroscopy (EDX) and the examination by means of wavelength-dispersive x-ray spectroscopy (WDX). For these further examination methods, provision is made of at least a third detector 119, which is arranged in the region of the sample chamber 120, for example between the beam guiding tube 104 and the object 114 laterally from the object 114. The SEM 100 furthermore has a fourth detector 121, which is arranged in the sample chamber 120. More precisely, the fourth detector 121 is arranged behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined are detected by the fourth detector 121.

Figure 2:
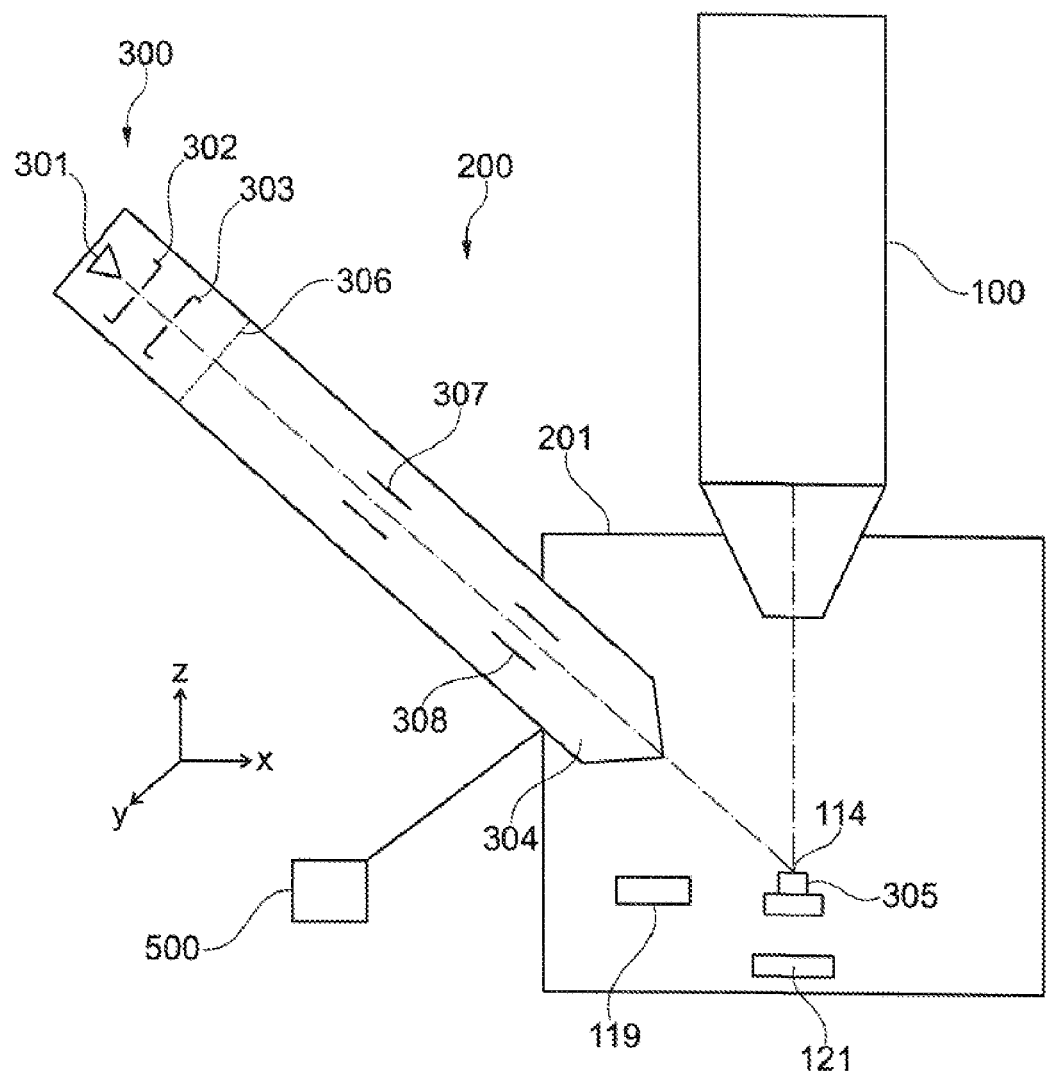
FIG. 2 shows a second embodiment of a particle beam apparatus according to the system described herein.

FIG. 2 shows a particle beam apparatus in the form of a combination apparatus 200. The combination apparatus 200 has two particle beam columns. On the one hand, the combination apparatus 200 is provided with the SEM 100, as already depicted in FIG. 1, but without the sample chamber 120. Rather, the SEM 100 is arranged at a sample chamber 201. The SEM 100 serves to generate a first particle beam, namely the primary electron beam already described further above. On the other hand, the combination apparatus 200 is provided with an ion beam apparatus 300, which is likewise arranged at the sample chamber 201.

The SEM 100 is arranged vertically in relation to the sample chamber 201. By contrast, the ion beam apparatus 300 is arranged inclined by an angle of approximately 50° in relation to the SEM 100. It has a second beam generator in the form of an ion beam generator 301. Ions, which form a second particle beam in the form of an ion beam, are generated by the ion beam generator 301. The ions are accelerated by means of an extraction electrode 302, which is at a predeterminable potential. The second particle beam then reaches through ion optics of the ion beam apparatus 300, wherein the ion optics comprise a condenser lens 303 and a second objective lens 304. The objective lens 304 ultimately generates an ion probe, which is focused on the object 114 arranged on a sample holder 305.

An adjustable aperture 306, a first electrode arrangement 307 and a second electrode arrangement 308 are arranged above the objective lens 304 (i.e. in the direction of the ion beam generator 301), wherein the first electrode arrangement 307 and the second electrode arrangement 308 are embodied as scanning electrodes. The second particle beam is scanned over the surface of the object 114 by means of the first electrode arrangement 307 and the second electrode arrangement 308, wherein the first electrode arrangement 307 acts in a first direction and the second electrode arrangement 308 acts in a second direction, which is counter to the first direction. Using this, there is a scanning in e.g. the x-direction. The scanning in a y-direction perpendicular thereto is brought about by further electrodes (not depicted here), which are rotated by 90°, at the first electrode arrangement 307 and at the second electrode arrangement 308.

The distances depicted in FIG. 2 between the individual units of the combination apparatus 200 are depicted in exaggerated fashion in order to better depict the individual units of the combination apparatus 200.

Figure 3:
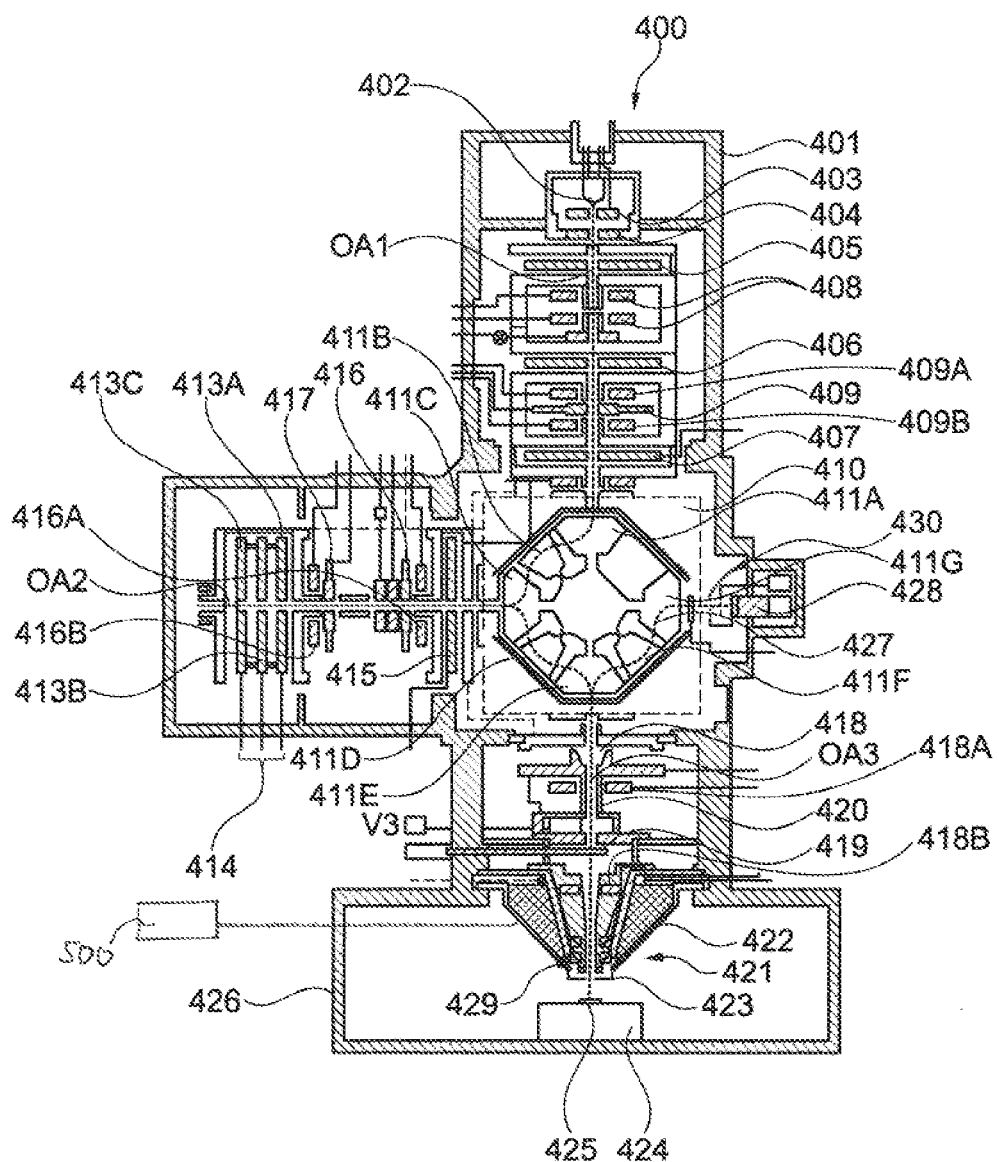
FIG. 3 shows a third embodiment of a particle beam apparatus according to the system described herein.

FIG. 3 is a schematic illustration of a further exemplary embodiment of a particle beam apparatus according to the system described herein. This exemplary embodiment of the particle beam apparatus is provided with the reference sign 400 and comprises a mirror corrector for correcting e.g. chromatic and spherical aberrations. The particle beam apparatus 400 comprises a particle beam column 401, which is embodied as an electron beam column and substantially corresponds to an electron beam column of a corrected SEM. However, the particle beam apparatus 400 is not restricted to an SEM with a mirror corrector. Rather, the particle beam apparatus can comprise any type of correction units.

The particle beam column 401 comprises a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 due to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is adjusted along the beam path using a beam guiding device. The beam guiding device of this exemplary embodiment comprises a source adjustment unit with two magnetic deflection units 408 arranged along the first optical axis OA1. Moreover, the particle beam apparatus 400 comprises electrostatic beam deflection units. A first electrostatic beam deflection unit 409, which is embodied as a quadrupole in one exemplary embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are adjusted for the purposes of adjusting the particle beam in respect of the axis of the third electrostatic lens 407 and the entrance window of a beam deflection device 410. The first electrostatic beam deflection unit 409, the first multi-pole unit 409A and the second multi-pole unit 409B can interact like a Wien filter.

The beam deflection device 410 is used as a particle beam deflector, which deflects the particle beam in a specific manner. The beam deflection device 410 comprises a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and it is deflected by the beam deflection device 410 in the direction of a second optical axis OA2. The beam deflection is performed by means of the first magnetic sector 411A, by means of the second magnetic sector 411B and by means of the third magnetic sector 411C by an angle of 30° to 120°. The second optical axis OA2 is therefore oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the exemplary embodiment in FIG. 3, the deflection with respect to the second optical axis OA2 and with respect to the third optical axis OA3 is provided by deflecting the particle beam at an angle of 90°. Hence, the third optical axis OA3 extends coaxially with respect to the first optical axis OA1. However, reference is made to the fact that the particle beam apparatus 400 according to the system described herein described here is not restricted to deflection angles of 90°. Rather, any suitable deflection angle can be selected by the beam deflection device 410, for example 70° or 110°, such that the first optical axis OA1 does not extend coaxially with respect to the third optical axis OA3. In respect of further details of the beam deflection device 410, reference is made to EP 1 388 882 A2.

After the particle beam was deflected by the first magnetic sector 411A, the second magnetic sector 411B, and the third magnetic sector 411C, the particle beam is guided along the second optical axis OA2. The particle beam is guided to an electrostatic mirror 414 and it extends on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 comprises a first mirror electrode 413A, a second mirror electrode 413B, and a third mirror electrode 413C. Electrons of the particle beam which are reflected back at the electrostatic mirror 414 once again extend along the second optical axis OA2 and re-enter the beam deflection device 410. Then, they are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to the object 425 which is intended to be examined. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

By means of the objective lens 421, the particle beam is focused in a focal plane in which the object 425 is arranged. The object 425 is arranged on a movable sample stage 424. The movable sample stage 424 is arranged in a sample chamber 426 of the particle beam apparatus 400.

The objective lens 421 can be embodied as a combination of a magnetic lens 422 and a sixth electrostatic lens 423. The end of the beam guiding tube 420 furthermore can be an electrode of an electrostatic lens. After emerging from the beam guiding tube 420, particles of the particle beam apparatus are decelerated to a potential of the object 425 arranged on the sample stage 424. The objective lens 421 is not restricted to a combination of the magnetic lens 422 and the sixth electrostatic lens 423. Rather, the objective lens 421 can assume any suitable form. By way of example, the objective lens also can be embodied as a purely magnetic lens or only as a purely electrostatic lens.

The particle beam which is focused onto the object 425 interacts with the object 425. Interaction particles are generated. In particular, secondary electrons are emitted from the object 425 or backscattered electrons are scattered back at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 comprises a first detector 419 which is arranged between the beam deflection device 410 and the objective lens 421 along the beam path. Secondary electrons traveling in directions aligned at a large angle with respect to the third optical axis OA3 are detected by the first detector 419. Backscattered electrons and secondary electrons which have a small axial distance with respect to the third optical axis OA3 at the location of the first detector 419—i.e. backscattered electrons and secondary electrons which have a small distance from the third optical axis OA3 at the location of the first detector 419—enter the beam deflection device 410 and are deflected to a second detector 428 by the fifth magnetic sector 411E, the sixth magnetic sector 411F and the seventh magnetic sector 411G along a detection beam path 427. By way of example, the deflection angle is 90° or 110°.

The first detector 419 generates detection signals which are largely generated by emitted secondary electrons. The detection signals which are generated by the first detector 419 and the second detector 428 are guided to an electronics unit (not depicted here) and used to obtain information about the properties of the interaction region of the focused particle beam with the object 425. In particular, the focused particle beam is scanned over the object 425 using a scanning device 429. Then, an image of the scanned region of the object 425 can be generated by the detection signals, which are generated by the first detector 419 and the second detector 428, and it can be displayed on a display unit, for example a monitor.

A filter grid 430 can be arranged upstream of the second detector 428. By way of example, the filter grid 430 is used to separate secondary electrons from the backscattered electrons due to the difference in the kinetic energy thereof.

Figure 4:
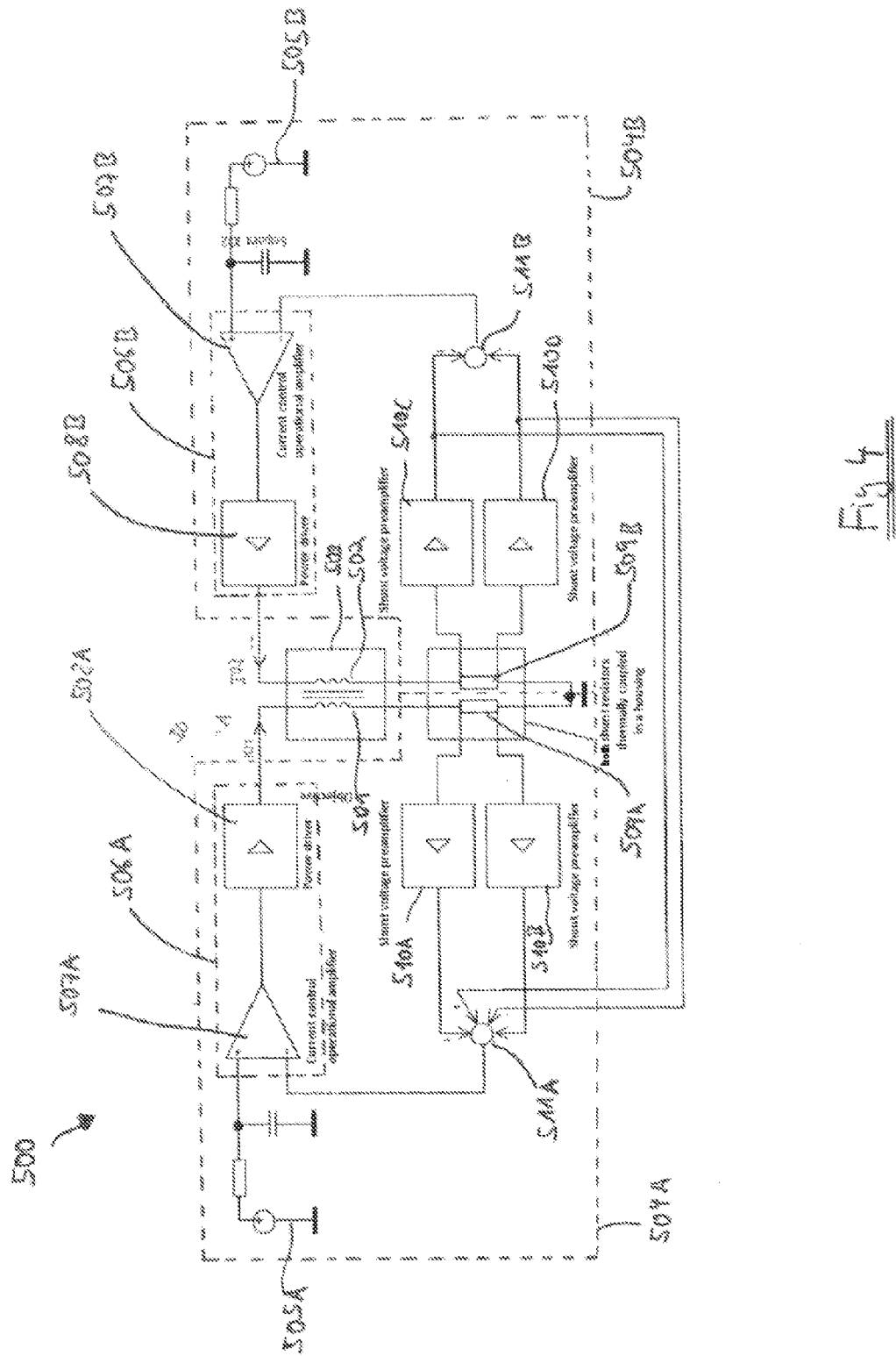
FIG. 4 shows a first embodiment of the circuit arrangement for providing coil currents.

FIG. 4 show a first exemplary embodiment of a circuit arrangement 500 which is used in the particle beam apparatuses 100, 200 and 400, according to the system described herein that were explained further above. The circuit arrangement 500 serves for providing a coil current for the respective objective lens of the individual particle beam apparatuses 100, 200 and 400, specifically the first objective lens 107 of the SEM 100, the second objective lens 304 of the ion beam apparatus 300 and the objective lens 421 of the particle beam apparatus 400 (cf. FIGS. 1 to 3). The circuit arrangement 500 may for example also be used for providing a coil current for coils of the sectors of the beam deflection device 410—namely the first magnetic sector 411A, the second magnetic sector 411B, the third magnetic sector 411C, the fourth magnetic sector 411D, the fifth magnetic sector 411E, the sixth magnetic sector 411F and the seventh magnetic sector 411G—of the particle beam apparatus 400.

In the embodiments of the particle beam apparatuses illustrated here, the objective lenses have a substantially identical construction. For the sake of simplicity, the objective lens in the circuit arrangement 500 now described below is provided with the reference sign 503. The objective lens 503 corresponds to the objective lenses mentioned further above.

The objective lens 503 has a first coil 501 and a second coil 502, which are wound onto a coil carrier for example in a bifilar fashion. The coil carrier has a cavity. A cooling liquid flows through the cavity in order to achieve a cooling of the first coil 501 and the second coil 502. The circuit arrangement 500 serves to provide a first coil current IO1 for the first coil 501 and a second coil current IO2 for the second coil 502.

The circuit arrangement 500 has a first circuit unit 504A, which provides the first coil current IO1. The first circuit unit 504A has a first setpoint value predefinition unit 505A, which predefines a first value in the form of a sum of the first coil current IO1 and the second coil to current IO2 (that is to say the summation current of the first coil current IO1 and the second coil current IO2) or in the form of a difference between the first coil current IO1 and the second coil current IO2 (that is to say the difference current from the first coil current IO1 and the second coil current IO2). Furthermore, the first circuit unit 504A has a first current control unit 506A, which has in particular a first current control operational amplifier 507A and a first power amplifier 508A. The first setpoint value predefinition unit 505A is connected to the first current control operational amplifier 507A via a line. Furthermore, the first current control operational amplifier 507A is connected to the first power amplifier 508A via a line in such a way that an output signal of the first current control operational amplifier 507A is amplified by the first power amplifier 508A and is output as output signal of the first power amplifier 508A. The first power amplifier 508A is in turn connected to the first coil 501 of the objective lens 503, wherein the first coil 501 obtains the output signal of the first power amplifier 508A as input signal. The input signal comprises the first coil current IO1. The first circuit unit 504A also has a first measuring resistor 509A in the form of a shunt resistor. The first measuring resistor 509A has a four-conductor terminal. The first measuring resistor 509A is connected to the first coil 501. By measuring a first voltage dropped across the first measuring resistor 509A, a first through-flow current is measured. Since the first voltage is related to the first through-flow current, it is possible to determine the current actually flowing through the first coil 501 (here the first through-flow current). The first voltage dropped across the first measuring resistor 509A is amplified, on the one hand, by means of a first measuring resistor voltage preamplifier 510A and a second measuring resistor voltage preamplifier 510B.

A second circuit unit 504B will now firstly be discussed below, said second circuit unit likewise being provided in the circuit arrangement 500. The second circuit unit 504B provides the second coil current IO2. The second circuit unit 504B has a second setpoint value predefinition unit 505B, which predefines a second value of the second coil current IO2. Furthermore, the second circuit unit 504B has a second current control unit 506B, which has in particular a second current control operational amplifier 507B and a second power amplifier 508B. The second setpoint value predefinition unit 505B is connected to the second current control operational amplifier 507B via a line. Furthermore, the second current control operational amplifier 507B is connected to the second power amplifier 508B via a line in such a way that an output signal of the second current control operational amplifier 507B is amplified by the second power amplifier 508B and is output as output signal of the second power amplifier 508B. The second power amplifier 508B is in turn connected to the second coil 502 of the objective lens 503, wherein the second coil 502 obtains the output signal of the second power amplifier 508B as input signal. The input signal comprises the second coil current IO2. The second circuit unit 504B also has a second measuring resistor 509B in the form of a shunt resistor. The second measuring resistor 509B also has a four-conductor terminal. The second measuring resistor 509B is connected to the second coil 502. By measuring a second voltage dropped across the second measuring resistor 509B, a second through-flow current is measured. Since the second voltage is related to the second through-flow current, it is possible to determine the current actually flowing through the second coil 502 (here the second through-flow current). The second voltage dropped across the second measuring resistor 509B is amplified, on the one hand, by means of a third measuring resistor voltage preamplifier 510C and a fourth measuring resistor voltage preamplifier 510D.

The first measuring resistor 509A and the second measuring resistor 509B are arranged on an individual mounting unit in such a way that the first measuring resistor 509A is thermally coupled to the second measuring resistor 509B, for example by connection via a thermal coupling unit. The thermal coupling by means of the thermal coupling unit is effected in such a way that a first thermal resistance of the first measuring resistor 509A with respect to the second measuring resistor 509B is less than a second thermal resistance of the first measuring resistor 509A and/or of the second measuring resistor 509B with respect to an environment of the first measuring resistor 509A and/or of the second measuring resistor 509B. By way of example, the first thermal resistance is 2 times, 5 times or 10 times less than the second thermal resistance. A thermal flux prevails between the first measuring resistor 509A and the second measuring resistor 509B in such a way that a temperature equalization between the two measuring resistors 509A, 509B can be performed. The temperatures of the two measuring resistors 509A and 509B remain substantially constant. This has the advantage that it is possible to choose the resistance values of the two measuring resistors 509A and 509B to be higher, in contrast to the prior art, without the abovementioned drifts increasing. High resistance values of the two measuring resistors 509A and 509B significantly increase the signal-to-noise ratio of the circuit arrangement 500, such that the focusing of the particle beam is stable. By way of example, the first measuring resistor 509A and the second measuring resistor 509B in each case have a resistance value in the range of 1 ohm to 10 ohms. However, the system described herein is not restricted to these values. Rather, any suitable resistance value may be used. In particular, the first measuring resistor 509A may be chosen in such a way that the voltage drop at the first measuring resistor 509A is greater than 1 V or greater than 2 V, for example even greater than 5 V. Furthermore, the second measuring resistor 509B may be chosen in such a way that the voltage drop at the second measuring resistor 509B is greater than 1 V or greater than 2 V, for example even greater than 5 V.

The first circuit unit 504A furthermore has a summation-difference unit 511A. The summation-difference unit 511A is designed for example as a circuit comprising operational amplifiers. This will still be discussed in more detail below. Further embodiments of the summation-difference unit 511A will be explained in greater detail further below. The summation-difference unit 511A is connected to the first measuring resistor voltage preamplifier 510A and to the second measuring resistor voltage preamplifier 510B in such a way that in each case the output signals of the two aforementioned measuring resistor voltage preamplifiers 510A, 510B serve as input signal of the summation-difference unit 511A. Furthermore, the summation-difference unit 511A obtains the two output signals of the third measuring resistor voltage preamplifier 510C and of the fourth measuring resistor voltage preamplifier 510D as input signal.

Figure 5:
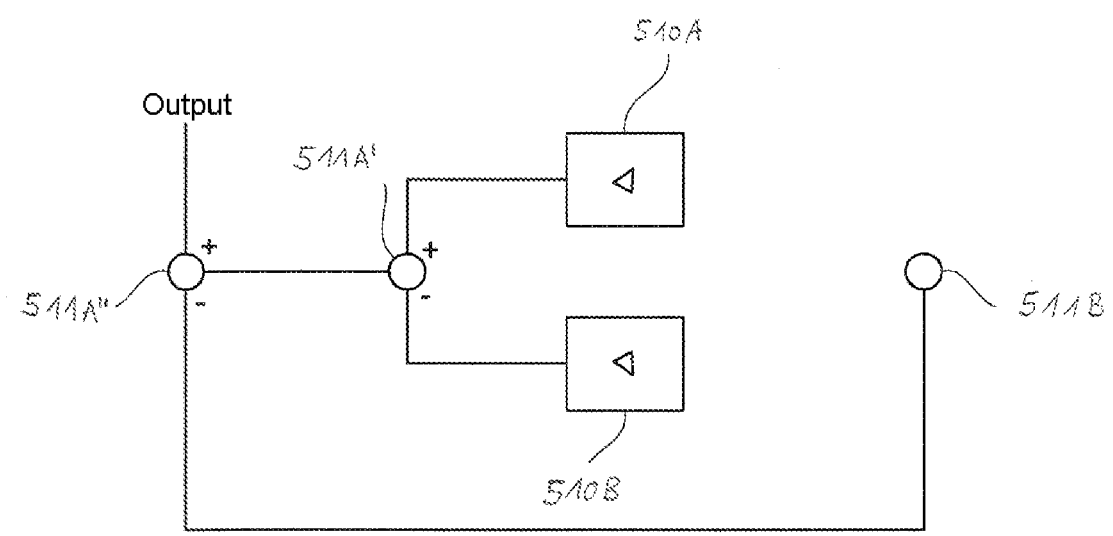
FIG. 5 shows a partial view of a further embodiment of the circuit arrangement according to FIG. 4.

FIG. 5 shows a further exemplary embodiment of the circuit arrangement 500, although only in a simplified partial view of the first measuring resistor voltage preamplifier 510A and of the second measuring resistor voltage preamplifier 510B. The summation-difference unit 511A is designed as a circuit comprising two operational amplifiers connected in series, namely a first operational amplifier unit 511A' and a second operational amplifier unit 511A". The first measuring resistor voltage preamplifier 510A and the second measuring resistor voltage preamplifier 510B are connected to the first operational amplifier unit 511A' in such a way that the output signals of the two aforementioned measuring resistor voltage preamplifiers 510A, 510B serve as input signals of the first operational amplifier unit 511A'. The first operational amplifier unit 511A' is connected to the second operational amplifier unit 511A" in such a way that the output signal of the first operational amplifier unit 511A' serves as input signal of the second operational amplifier unit 511A". The output signal of a difference unit 511B is used as further input signal of the second operational amplifier unit 511A".

Figure 6:
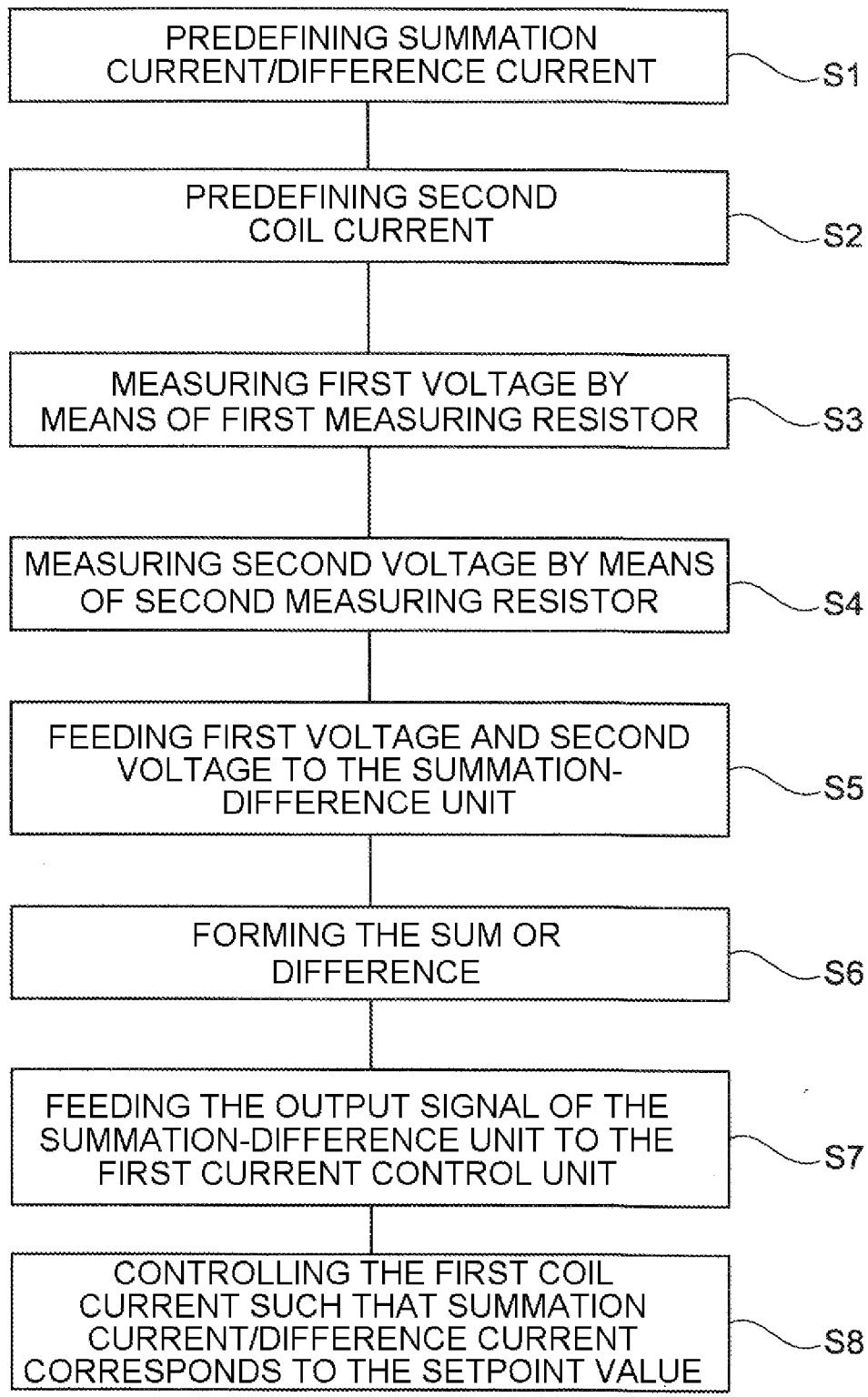
FIG. 6 shows a flow diagram of one embodiment of a method according to the system described herein.

FIG. 6 shows a flow diagram of the method according to the system described herein, which will be explained firstly on the basis of the exemplary embodiment in accordance with FIG. 4. A method step S1 involves predefining a first value in the form of the summation current or in the form of the difference current. By way of example, the first value is set manually or automatically by means of the first setpoint value predefinition unit 505A. Furthermore, a method step S2 involves predefining a second value of the second coil current IO2 by means of the second setpoint value predefinition unit 505B. By way of example, provision is made for setting the second current of the second coil current IO2 in such a way that the power of the objective lens 503 has a desired value, for example is constant. If it is assumed approximately that the resistance of the two coils is identical, then the following holds true approximately for a variable K: $K=(IO1)^2+(IO2)^2=\text{constant}$.

Here, too, it is provided, for example, that the second value of the second coil current IO2 is set manually or automatically by means of the second setpoint value predefinition unit 505B.

In the method according to the system described herein, in a method step S3 it is then provided that the first voltage is measured by means of the first measuring resistor 509A. Furthermore, in a method step S4, the second voltage is measured by means of the second measuring resistor 509B. By measuring the first voltage it is possible to determine the first through-flow current. By measuring the second voltage it is possible to determine the second through-flow current.

A further method step S5 involves feeding the first voltage and the second voltage to the summation-difference unit 511A. By means of the summation-difference unit 511A, in a method step S6, the sum of the first voltage and the second voltage is then formed and output as output signal of the summation-difference unit 511A. As an alternative thereto, it is provided that the difference between the first voltage and the second voltage is formed and output as output signal of the summation-difference unit 511A. A further method step S7 involves feeding the output signal of the summation-difference unit 511A to the first current control unit 506A as input signal. To put it more precisely, the output signal of the summation-difference unit 511A is fed to the first current control operational amplifier 507A. The first coil current IO1 is then controlled in such a way that the summation current (if the latter was chosen in method step S1), or the difference current (if the latter was chosen as an alternative in method step S1) corresponds to the setpoint value chosen in the first method step S1.

In the exemplary embodiment in accordance with FIG. 4, provision is furthermore made for feeding the second voltage as input signal to the difference unit 511B. Furthermore, a difference signal is formed as output signal by means of the difference unit 511B. The output signal of the difference unit 511B is fed to the second current control unit 506B as input signal. The second coil current IO2 is then controlled by means of the second current control unit 506B on the basis of the output signal of the difference unit 511B. In particular, provision is made for choosing the second coil current IO2 in such a way that the power of the objective lens 503 is substantially constant.

The noise of the circuit arrangement 500 is lower than the circuit arrangements known heretofore from the prior art for controlling the current for the two abovementioned coils. This is explained below on the basis of the example of control of the summation current of the first coil current IO1 and the second coil current IO2 and a parallel winding sense of the first coil 501 and the second coil 502. The same correspondingly holds true for the control of the difference current from the first coil current IO1 and the second coil current IO2 and given an antiparallel winding sense of the first coil 501 and the second coil 502.

The beam deflection unit in the form of the objective lens 503 is excited by the first coil 501 and the second coil 502, which have for example an identical number of turns. Each of the two abovementioned coils 501, 502 may generate a maximum partial excitation that may be higher than half of the maximum desired total excitation. This is desirable in the case of a power-constant driving by control of the second coil current IO2. The first setpoint value predefinition unit 505A and the first current control unit 506A are beset by noise. Both together generate the first coil current IO1 in the first coil 501, said first coil current having a first DC current component and a first AC current component. Furthermore, the second setpoint value predefinition unit 505B and the second current control unit 506B are also beset by noise. Both together generate the second coil current IO2 in the second coil 502, said second coil current having a second DC current component and a second AC current component. The polarity of the first coil 501 and the second coil 502 and also the circuitry connection of the summation-difference unit 511A are configured in such a way that when the second setpoint value predefinition unit 505B is controlled in a suitable manner, the DC current component of the total excitation of the beam deflection unit in the form of objective lens 503 can reach the maximum desired value. The first current control unit 506A, by means of the summation current measurement, can compensate for the AC current component in the second coil current IO2 by means of a corresponding AC current component in the first coil current IO1. All that then remains is just the AC current component in the first coil current IO1, which is generated directly in the first coil current IO1 by the noise in the first setpoint value predefinition unit 505A and the first current control unit 506A. However, this only acts on the first coil 501, that is to say on half the number of turns. The noise that arises during the measurement at the second measuring resistor 509B possibly owing to the use of the measuring resistor voltage preamplifiers 510C and 510D cannot be compensated for and acts on the first coil 501 (with half the number of turns). However, the noise of the circuit arrangement 500 overall becomes better than in the prior art.

In a further exemplary embodiment of the method according to the system described herein, it is provided that predefining the first value of the summation current or the difference current by means of the first setpoint value predefinition unit 505A in method step S1 comprises the following substeps. Firstly, the summation current or the difference current is set to a third value, wherein the third value is greater than the first value in the case of an increase in the summation current or the difference current to the first value. This results in a ramplike setting of the first coil current IO1, as a result of which the actual first value is reached more rapidly. Provision is then made, upon reaching or shortly before reaching the desired first value, for stopping the ramplike setting by setting the first value.

In method step S2, a similar procedure may be performed with the second coil current IO2. The second coil current IO2 is firstly set to a fourth value, wherein the fourth value is greater than the desired second value of the second coil current IO2 in the case of an increase in the second coil current IO2 to the second value. This results in a ramplike setting of the second coil current IO2, as a result of which the actually desired second value of the second coil current IO2 is reached more rapidly. Here, too, provision is then made, upon reaching or shortly before reaching the desired second value of the second coil current IO2, for stopping the ramplike setting by setting the second value.

Further exemplary embodiments of the circuit arrangement 500 are discussed below, wherein symbols of circuit constructional units which are used in the further exemplary embodiments of the circuit arrangement 500 will firstly be explained with reference to FIGS. 7 to 17A.

Figure 7:
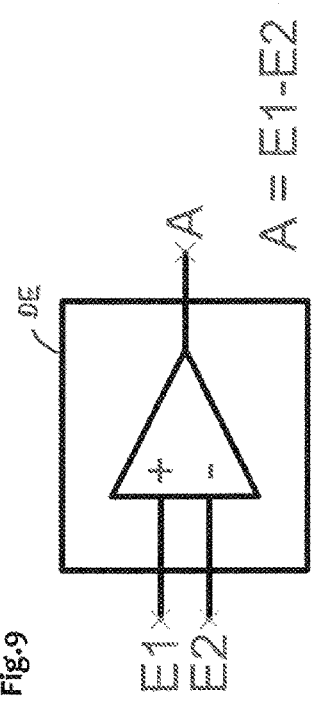
FIG. 7 shows a symbol of a first circuit constructional unit.
Figure 8:
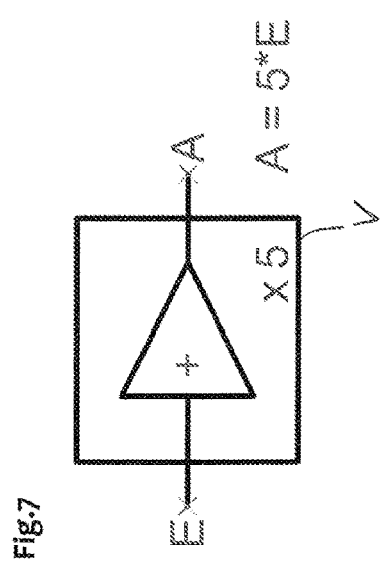
FIG. 8 shows a technical implementation of the first circuit constructional unit according to FIG. 7.

FIG. 7 shows the symbol of a preamplifier V having an input E and having an output A. The sign "+" at the input E denotes a noninverting input. The expression "×5" means that the input is amplified 5-fold. It thus holds true that: $A=5 \times E$. FIG. 8 shows the actual embodiment of the preamplifier V having the input E and the output A. The preamplifier V comprises an operational amplifier OV and resistors $R_1$ and $R_2$. $R_2$ has a resistance value 4 times that of $R_1$.

Figure 9:
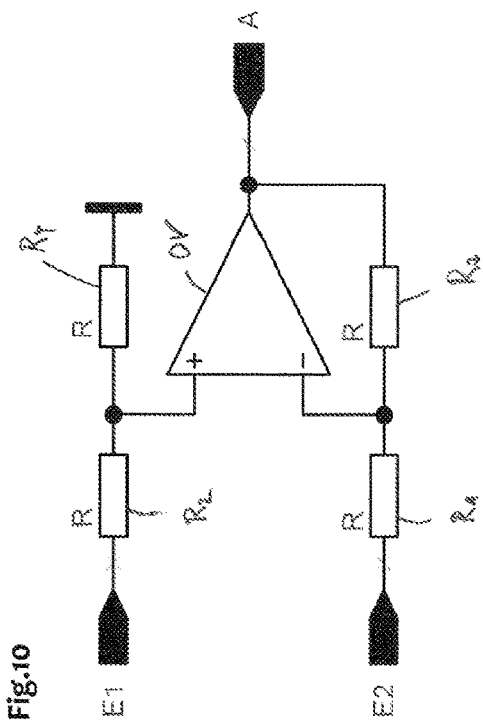
FIG. 9 shows a symbol of a second circuit constructional unit.
Figure 10:
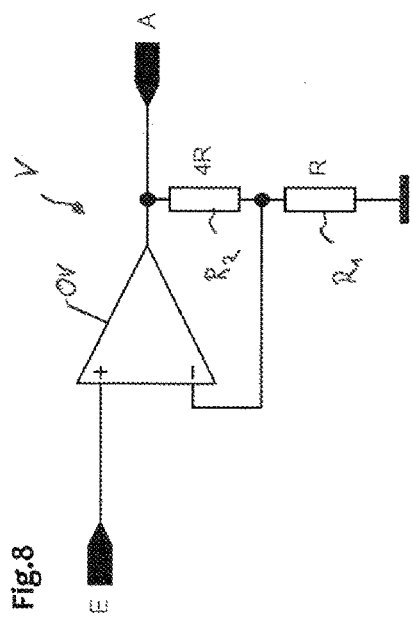
FIG. 10 shows a technical implementation of the second circuit constructional unit according to FIG. 9.

FIG. 9 shows the symbol of a difference unit DE having a first input E1, a second input E2 and an output A. The sign "+" at the first input E1 denotes a noninverting input. By contrast, the sign "−" at the second input E2 denotes an inverting input. It holds true that: $A=E1-E2$. FIG. 10 shows the actual embodiment of the difference unit DE having the first input E1, the second input E2 and the output A. The difference unit DE comprises an operational amplifier OV and resistors $R_1$ to $R_4$ having identical resistance values.

Figure 11:
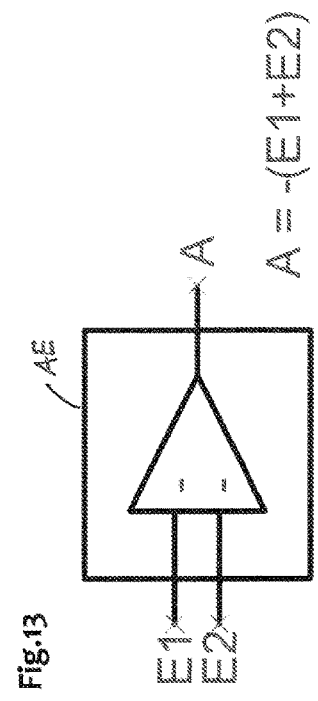
FIG. 11 shows a symbol of a third circuit constructional unit.
Figure 12:
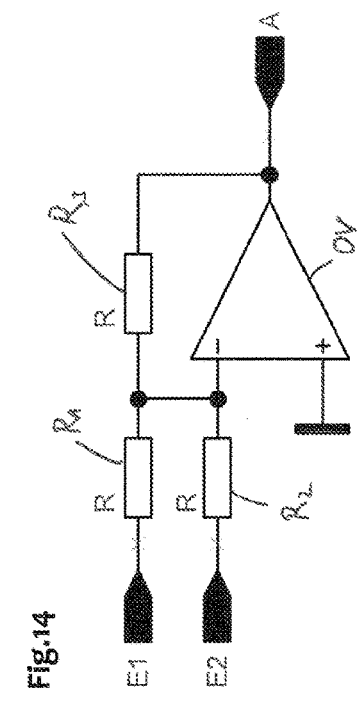
FIG. 12 shows a technical implementation of the third circuit constructional unit according to FIG. 11.

FIG. 11 shows the symbol of a combination of a preamplifier V according to FIG. 7 and a difference unit DE according to FIG. 9 having a first input E1, having a second input E2 and having an output A. The sign "+" at the first input E1 denotes a noninverting input. By contrast, the sign "−" at the second input E2 denotes an inverting input. It holds true that: $A=5 \times (E1-E2)$. FIG. 12 shows the actual embodiment of the abovementioned combination. It comprises an operational amplifier OV and resistors $R_1$ to $R_4$. $R_3$ has a resistance value 5 times that of $R_2$. $R_4$ has a resistance value 5 times that of $R_1$.

Figure 13:
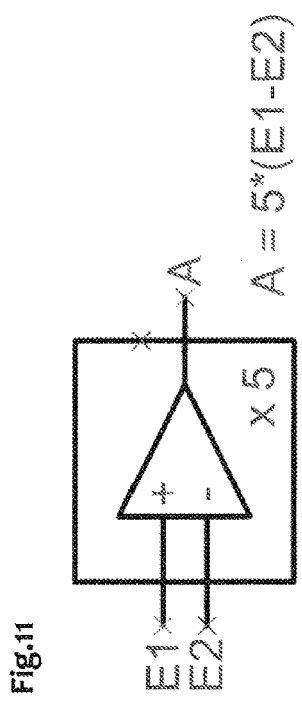
FIG. 13 shows a symbol of a fourth circuit constructional unit.
Figure 14:
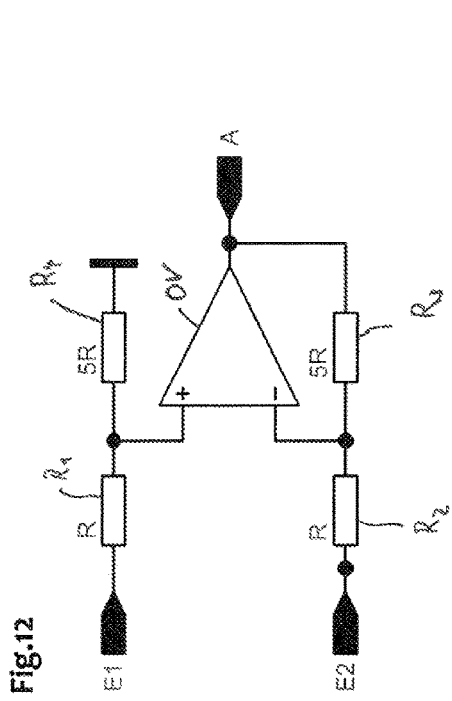
FIG. 14 shows a technical implementation of the fourth circuit constructional unit according to FIG. 13.

FIG. 13 shows the symbol of an inverting addition unit AE having a first input E1, a second input E2 and an output A. The sign "−" at the first input E1 and the second input E2 denotes an inverting input. It holds true that: $A=-(E1+E2)$. FIG. 14 shows the actual embodiment of the inverting addition unit AE having the first input E1, the second input E2 and the output A. The inverting addition unit AE in turn comprises an operational amplifier OV and resistors $R_1$ to $R_3$ having identical resistance values.

Figure 15:
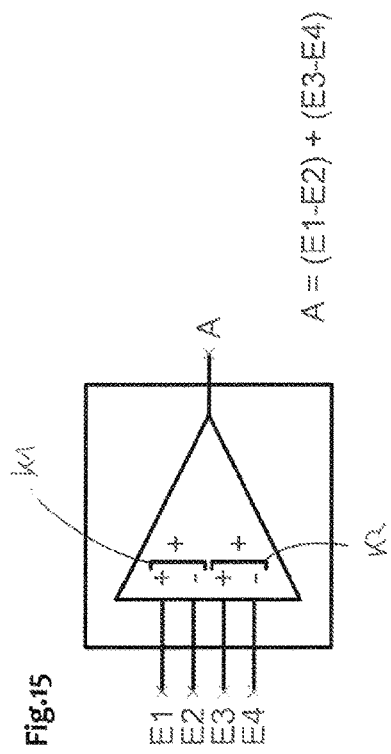
FIG. 15 shows a symbol of a fifth circuit constructional unit.
Figure 16:
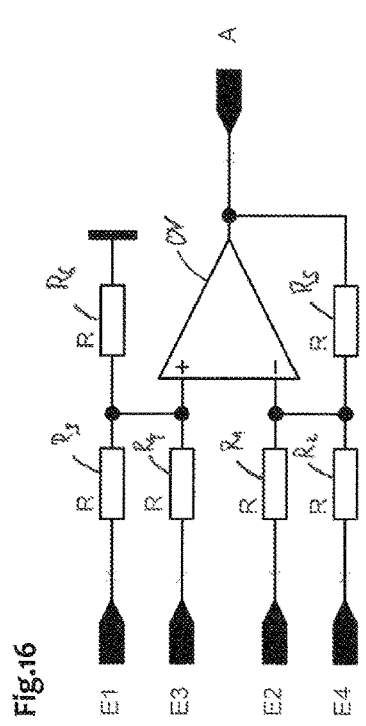
FIG. 16 shows a technical implementation of the fifth circuit constructional unit according to FIG. 15.

FIG. 15 shows the symbol of a combination of an addition unit AE and two difference units DE. The combination has four inputs, namely a first input E1, a second input E2, a third input E3 and a fourth input E4. Furthermore, the combination has an output A. The sign "+" at the first input E1 and at the third input E3 denotes in each case a noninverting input. By contrast, the sign "−" at the second input E2 and at the fourth input E4 denotes in each case an inverting input. A first square bracket K1 symbolizes a combination of the first input E1 and the second input E2 to form an internal output and the forwarding thereof to an internal noninverting input. Furthermore, a second square bracket K2 symbolizes a combination of the third input E3 and the fourth input E4 to form an internal output and the forwarding thereof to an internal noninverting input. It holds true that: A=(E1−E2)+(E3−E4). FIG. 16 shows the actual embodiment of the abovementioned combination having the first input E1, the second input E2, the third input E3, the fourth input E4 and the output A. The combination comprises an operational amplifier OV and resistors $R_1$ to $R_6$ having identical resistance values.

Figure 17:
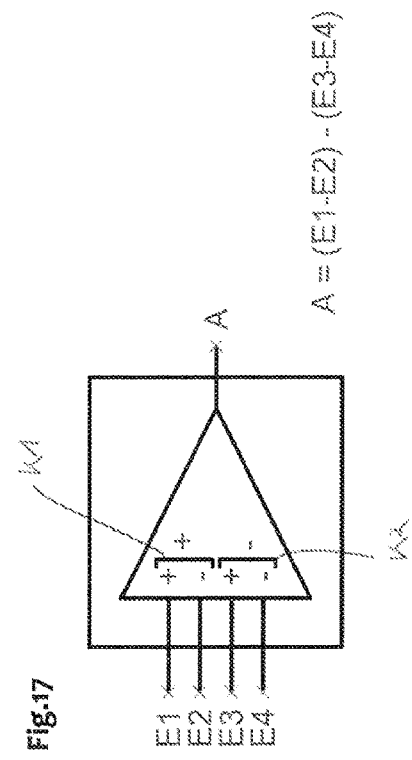
FIG. 17 shows a symbol of a sixth circuit constructional unit.
Figure 17A:
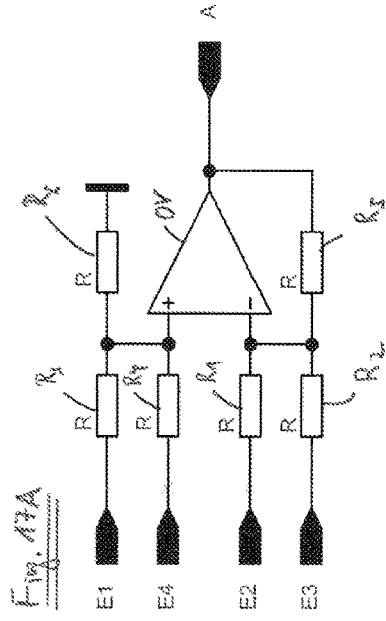
FIG. 17A shows a technical implementation of a sixth circuit constructional unit according to FIG. 17.

FIG. 17 shows the symbol of a combination of a difference unit DE and two further difference units DE. The combination has four inputs, namely a first input E1, a second input E2, a third input E3 and a fourth input E4. Furthermore, the combination has an output A. The sign "+" at the first input E1 and at the third input E3 denotes in each case a noninverting input. By contrast, the sign "−" at the second input E2 and at the fourth input E4 denotes in each case an inverting input. A first square bracket K1 symbolizes a combination of the first input E1 and the second input E2 to form an internal output and the forwarding thereof to an internal noninverting input. Furthermore, a second square bracket K2 symbolizes a combination of the third input E3 and the fourth input E4 to form an internal output and the forwarding thereof to an internal inverting input. It holds true that: A=(E1−E2)−(E3−E4)=(E1−E2)+(E4−E3). FIG. 17A shows the actual embodiment of the abovementioned combination having the first input E1, the second input E2, the third input E3, the fourth input E4 and the output A. The combination comprises an operational amplifier OV and resistors $R_1$ to $R_6$ having identical resistance values.

In further embodiments, provision is made for providing the operational amplifiers OV in FIGS. 7 to 17A with an external output stage. This is carried out for example analogously to the first current control unit 506A in FIG. 4, which is composed for example of the first current control operational amplifier 507A and the first power amplifier 508A. As a result, the operational amplifiers are not heated excessively by the driving of the external load and remain stable.

Further exemplary embodiments of the circuit arrangement 500 will now be discussed in greater detail below, wherein the symbols from FIGS. 7 to 17A will now be used.

Figure 18:
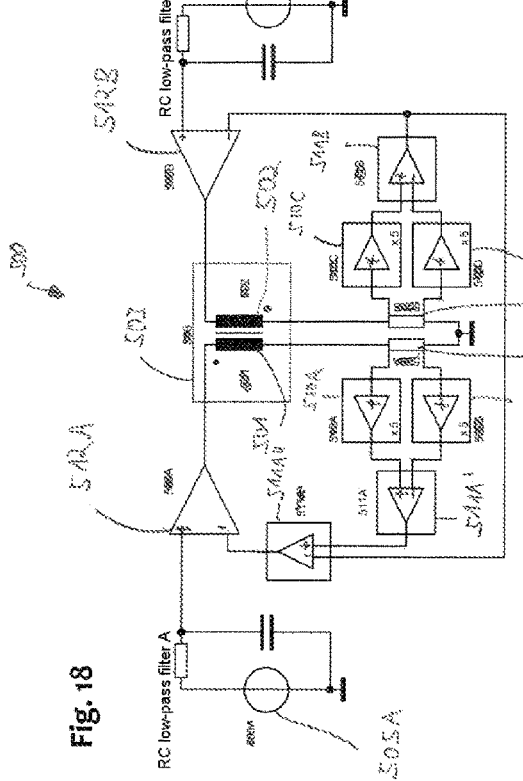
FIG. 18 shows a second embodiment of the circuit arrangement for providing coil currents.

FIG. 18 shows an embodiment of the circuit arrangement 500 which is based on FIG. 4. Identical component parts are provided with identical reference signs. However, the first current control operational amplifier is now provided with the reference sign 512A, and the second current control operational amplifier is now provided with the reference sign 512B. Both the first current control operational amplifier 512A and the second current control operational amplifier 512B in each case have an integrated output stage. In the embodiment in accordance with FIG. 18, the voltage dropped across the first measuring resistor 509A is measured using the first measuring resistor voltage preamplifier 510A and the second measuring resistor voltage preamplifier 510B. The two aforementioned measuring resistor voltage preamplifiers 510A and 510B are designed as preamplifiers V in accordance with FIG. 7. The first operational amplifier unit 511A' and the second operational amplifier unit 511A" of the summation-difference unit 511A are connected downstream of the two aforementioned measuring resistor voltage preamplifiers 510A and 510B. The first operational amplifier unit 511A' and the second operational amplifier unit 511A" are designed in each case as difference units DE (cf. FIG. 9). The voltage dropped across the second measuring resistor 509B is measured using the third measuring resistor voltage preamplifier 510C and the fourth measuring resistor voltage preamplifier 510D. The two aforementioned measuring resistor voltage preamplifiers 510C and 510D are designed as preamplifiers V in accordance with FIG. 7. The difference unit 511B in the form of a difference unit DE (cf. FIG. 9) is connected downstream of the two aforementioned measuring resistor voltage preamplifiers 510C and 510D. The output of the difference unit 511B is passed as input signal to the second operational amplifier unit 511A".

Figure 19:
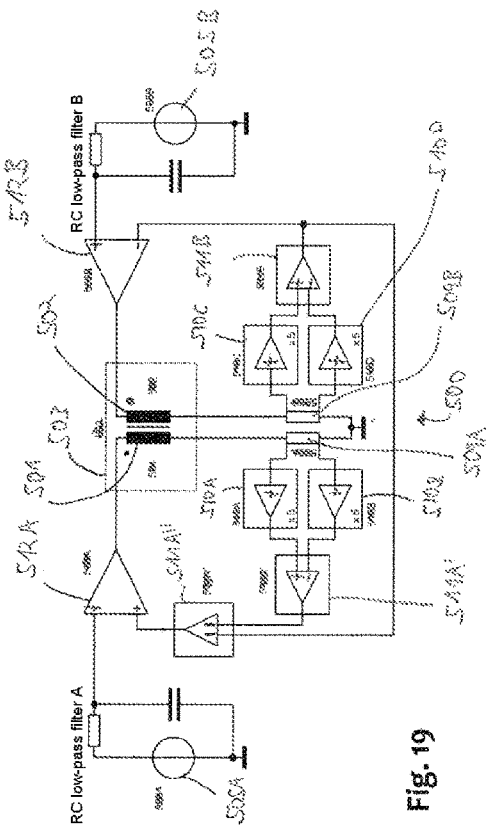
FIG. 19 shows a third embodiment of the circuit arrangement for providing coil currents.

FIG. 19 shows a further embodiment of the circuit arrangement 500 which is based on FIG. 18. Identical component parts are provided with identical reference signs. Reference is firstly made to all the explanations above. In contrast to the exemplary embodiment in accordance with FIG. 18, the exemplary embodiment in accordance with FIG. 19 comprises an addition unit AE (cf. FIG. 13) as second operational amplifier unit 511A". The winding sense of the first coil 501 and the winding sense of the second coil 502 are not antiparallel, but rather parallel. This is identified by the dots next to the feeds of the first coil 501 and the second coil 502. In order to compensate for the inverting behavior of the second operational amplifier 511A", the inputs are interchanged in the first current control operational amplifier 512A.

Figure 20:
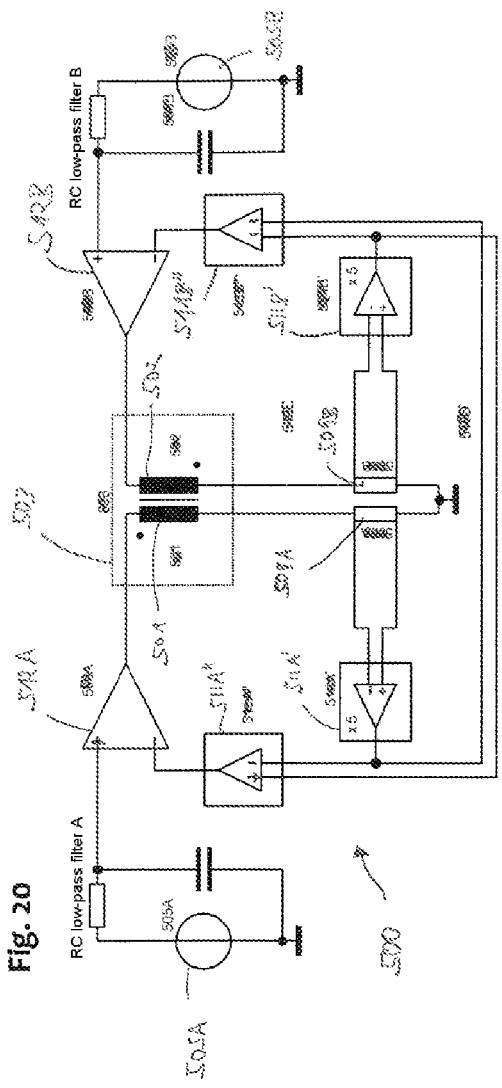
FIG. 20 shows a fourth embodiment of the circuit arrangement for providing coil currents.

FIG. 20 shows yet another embodiment of the circuit arrangement 500 which is based on FIG. 4. Identical component parts are provided with identical reference signs. However, the first current control operational amplifier is then provided with the reference sign 512A, and the second current control operational amplifier is now provided with the reference sign 512B. Both the first current control operational amplifier 512A and the second current control operational amplifier 512B in each case have an integrated output stage. In the embodiment in accordance with FIG. 20, the voltage dropped across the first measuring resistor 509A is measured using the first operational amplifier unit 511A'. The first operational amplifier unit 511A' is a combination of a difference unit DE and a preamplifier unit V (cf. FIG. 11). The second operational amplifier unit 511A" connected downstream of the first operational amplifier unit 511A' obtains the output signal of the first operational amplifier unit 511A' as input signal. The second operational amplifier unit 511A" is designed as a difference unit DE (cf. FIG. 9). The voltage dropped across the second measuring resistor 509B is measured using the difference unit 511B'. The difference unit 511B' is designed as a combination of a difference unit DE and a preamplifier unit V (cf. FIG. 11). The output signal of the difference unit 511B' is likewise used as input signal of the second operational amplifier unit 511A". Furthermore, the output signal of the first operational amplifier unit 511A' and the output signal of the difference unit 511B' are passed in each case as input signal to a further addition unit 511B", which is designed as in FIG. 13. The further addition unit 511B" is connected to the second current control operational amplifier 512B.

Figure 21:
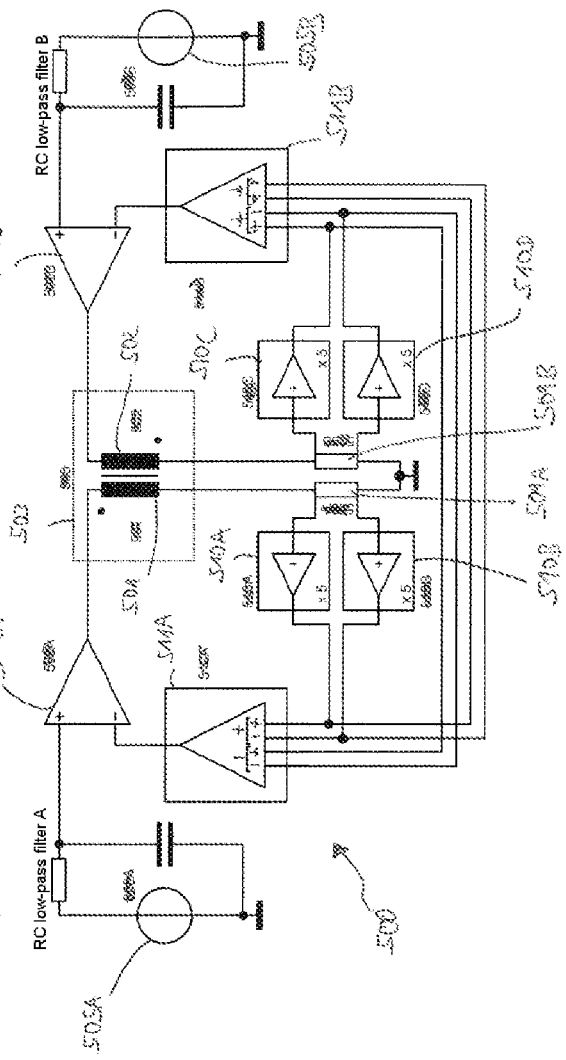
FIG. 21 shows a fifth embodiment of the circuit arrangement for providing coil currents.

FIG. 21 shows an embodiment of the circuit arrangement 500 which is based once again on FIG. 4. Identical component parts are provided with identical reference signs. However, the first current control operational amplifier is then provided with the reference sign 512A, and the second current control operational amplifier is now provided with the reference sign 512B. Both the first current control operational amplifier 512A and the second current control operational amplifier 512B in each case have an integrated output stage. In the embodiment in accordance with FIG. 21, the voltage dropped across the first measuring resistor 509A is measured using the first measuring resistor voltage preamplifier 510A and the second measuring resistor voltage preamplifier 510B. The two aforementioned measuring resistor voltage preamplifiers 510A and 510B are designed as preamplifiers V in accordance with FIG. 7. The summation-difference unit 511A is connected downstream of the two aforementioned measuring resistor voltage preamplifiers 510A and 510B. The output signals of the two aforementioned measuring resistor voltage preamplifiers 510A and 510B are used as input signals of the summation-difference unit 511A. The summation-difference unit 511A is designed as a combination of three difference units DE (cf. FIG. 17). The voltage dropped across the second measuring resistor 509B is measured using the third measuring resistor voltage preamplifier 510C and the fourth measuring resistor voltage preamplifier 510D. The two aforementioned measuring resistor voltage preamplifiers 510C and 510D are designed as preamplifiers V in accordance with FIG. 7. The difference unit 511B in the form of a combination of an addition unit AE and two difference units DE is connected downstream of the two aforementioned measuring resistor voltage preamplifiers 510C and 510D (cf. FIG. 15). The output signals of the third measuring resistor voltage preamplifier 510C and of the fourth measuring resistor voltage preamplifier 510D are used as input signals of the difference unit 511B. Furthermore, the output signals of the third measuring resistor voltage preamplifier 510C and of the fourth measuring resistor voltage preamplifier 510D are used as input signals of the summation-difference unit 511A. The output signals of the two aforementioned measuring resistor voltage preamplifiers 510A and 510B are used as input signals of the difference unit 511B.

FIG. 22 shows a further embodiment of the circuit arrangement 500 which is based once again on FIG. 4. Identical component parts are provided with identical reference signs. However, the first current control operational amplifier is now provided with the reference sign 512A, and the second current control operational amplifier is now provided with the reference sign 512B. Both the first current control operational amplifier 512A and the second current control operational amplifier 512B in each case have an integrated output stage. In the embodiment in accordance with FIG. 22, the voltage dropped across the first measuring resistor 509A is measured using the first measuring resistor voltage preamplifier 510A and the second measuring resistor voltage preamplifier 510B. The two aforementioned measuring resistor voltage preamplifiers 510A and 510B are designed as preamplifiers V in accordance with FIG. 7. The summation-difference unit 511A is connected downstream of the two aforementioned measuring resistor voltage preamplifiers 510A and 510B. The output signals of the two aforementioned measuring resistor voltage preamplifiers 510A and 510B are used as input signals of the summation-difference unit 511A. The summation-difference unit 511A is designed as a combination of three difference units DE (cf. FIG. 17). The voltage dropped across the second measuring resistor 509B is measured using the third measuring resistor voltage preamplifier 510C and the fourth measuring resistor voltage preamplifier 510D. The two aforementioned measuring resistor voltage preamplifiers 510C and 510D are designed as preamplifiers V in accordance with FIG. 7. The difference unit 511B in the form of a difference unit DE is connected downstream of the two aforementioned measuring resistor voltage preamplifiers 510C and 510D (cf. FIG. 9). The output signals of the third measuring resistor voltage preamplifier 510C and of the fourth measuring resistor voltage preamplifier 510D are used as input signals of the difference unit 511B. Furthermore, the output signals of the third measuring resistor voltage preamplifier 510C and of the fourth measuring resistor voltage preamplifier 510D are used as input signals of the summation-difference unit 511A.

FIG. 23 shows an embodiment of the circuit arrangement 500 which is based on FIG. 4. Identical component parts are provided with identical reference signs. However, the first current control operational amplifier is then provided with the reference sign 512A, and the second current control operational amplifier is now provided with the reference sign 512B. Both the first current control operational amplifier 512A and the second current control operational amplifier 512B in each case have an integrated output stage. In the embodiment in accordance with FIG. 23, the voltage dropped across the first measuring resistor 509A is measured using the first operational amplifier unit 511A'. The first operational amplifier unit 511A' is a combination of a difference unit DE and a preamplifier unit V (cf. FIG. 11). The second operational amplifier unit 511A" connected downstream of the first operational amplifier unit 511A' obtains the output signal of the first operational amplifier unit 511A' as input signal. The second operational amplifier unit 511A" is designed as a difference unit DE (cf. FIG. 9). The voltage dropped across the second measuring resistor 509B is measured using the difference unit 511B. The difference unit 511B is designed as a combination of a difference unit DE and a preamplifier unit V (cf. FIG. 11). The output signal of the difference unit 511B is likewise used as input signal of the second operational amplifier unit 511A". Furthermore, the output signal of the difference unit 511B is used as input signal of the second current control operational amplifier 512B.

Figure 24:
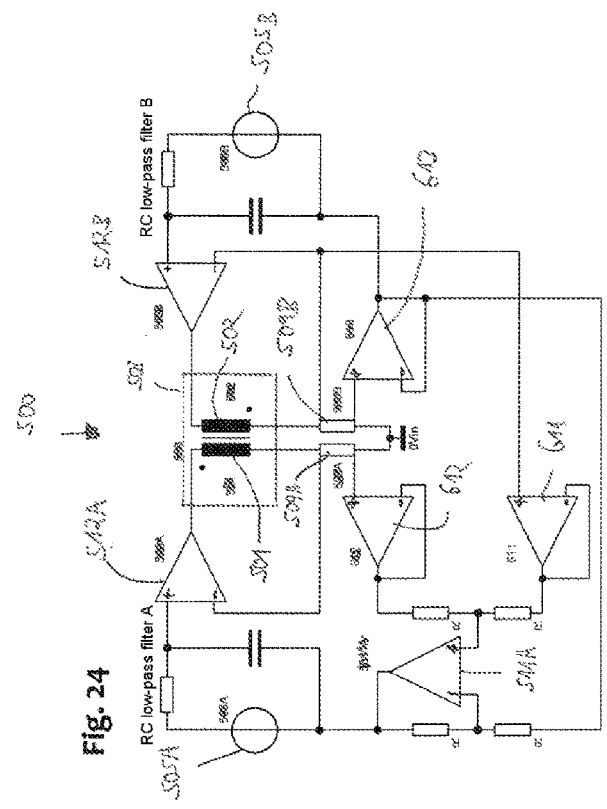
FIG. 24 shows an eighth embodiment of the circuit arrangement for providing coil currents.

FIG. 24 shows an embodiment of the circuit arrangement 500 which is based on FIG. 4. Identical component parts are provided with identical reference signs. However, the first current control operational amplifier is now provided with the reference sign 512A, and the second current control operational amplifier is now provided with the reference sign 512B. Both the first current control operational amplifier 512A and the second current control operational amplifier 512B in each case have an integrated output stage. The first circuit unit comprises the summation-difference unit 511A in the form of an operational amplifier and two impedance converters, namely a first impedance converter 611 and a second impedance converter 612. By contrast, the second circuit unit comprises only a single impedance converter, namely a third impedance converter 613. In this embodiment of the circuit arrangement 500, some of the adding or subtracting units (for example the impedance converters 611 to 613) are arranged outside the current control loop. This has the advantage that said adding or subtracting units could be operated with less bandwidth. In this embodiment, however, they are not yet connected up in this way. It is true that the embodiment in accordance with FIG. 24 does not have fewer component parts than the embodiment in accordance with FIG. 23. However, the embodiment in FIG. 24 requires fewer precision resistors R than in the embodiment in accordance with FIG. 23.

Figure 25:
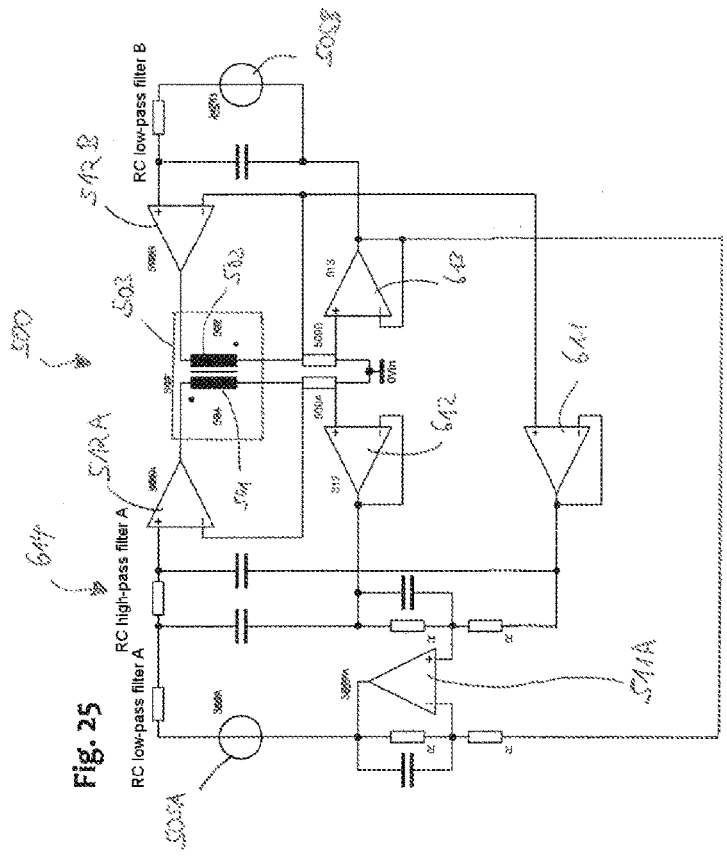
FIG. 25 shows a ninth embodiment of the circuit arrangement for providing coil currents.

FIG. 25 shows an embodiment of the circuit arrangement 500 which is based on FIG. 24. Identical component parts are provided with identical reference signs. In contrast to the exemplary embodiment in FIG. 24, the embodiment in FIG. 25 comprises an RC high-pass filter 614. Since, in the exemplary embodiment in FIG. 24, the summation-difference unit 511A is part of the current control loop, the summation-difference unit 511A makes a significant contribution to the total noise of the circuit arrangement 500. By means of a "by pass" high-pass filter in the form of the RC high-pass filter 614, it is possible to operate the differential amplifier (that is to say the summation-difference unit 511A), with a small bandwidth. The total noise of the circuit arrangement 500 is thus reduced.

Figure 26:
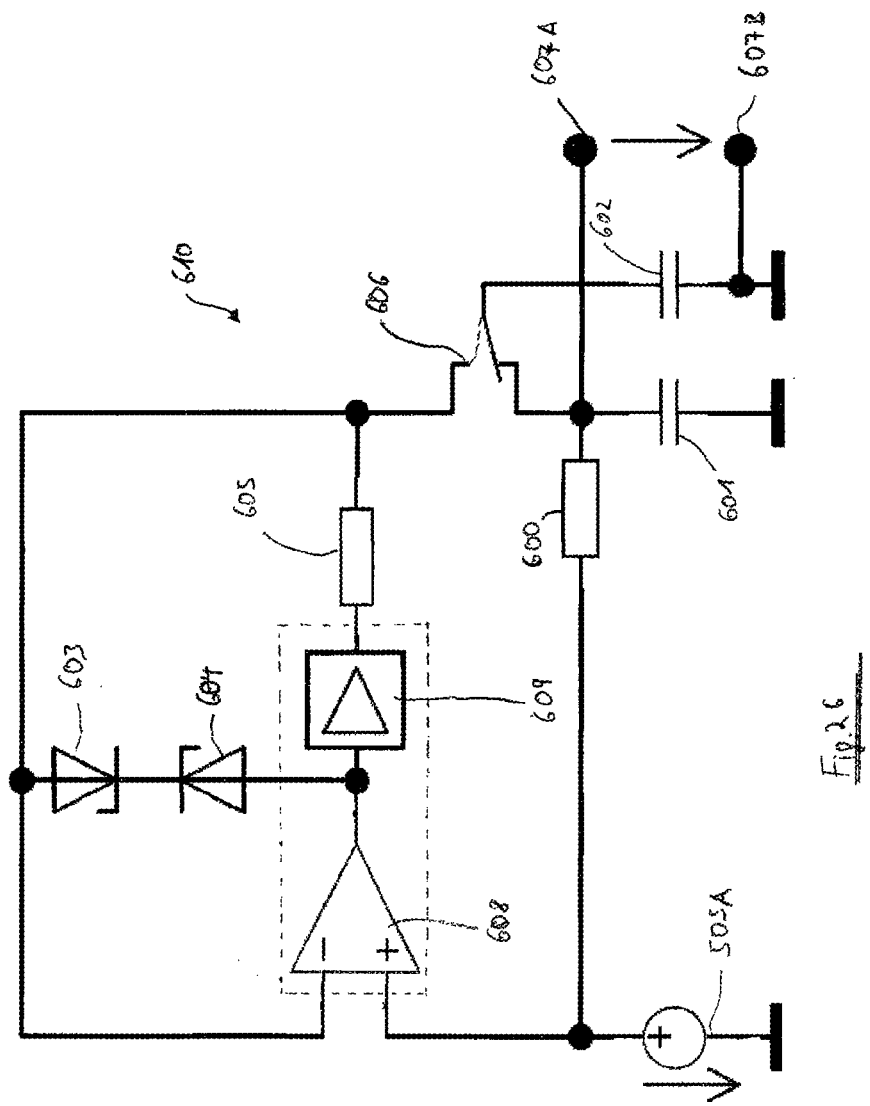
FIG. 26 shows one embodiment of a switchable low-pass filter for the circuit arrangement for providing coil currents.

FIG. 26 shows an embodiment of a switchable low-pass filter 610 having a charging circuit, said filter being used for example in the setpoint value predefinition of the summation current or the difference current. The construction of the switchable low-pass filter 610 will be explained first. The function of the switchable low-pass filter 610 will be explained afterward. The switchable low-pass filter 610 has a charging circuit comprising an operational amplifier 608, a first Zener diode 603, a second Zener diode 604, a power driver 609, a first resistor 605 and a switch unit 606. The first setpoint value predefinition unit 505A is line-connected to the operational amplifier 608. The operational amplifier 608 is in turn line-connected to the power driver 609 in the form of an amplifier. The power driver 609 is line-connected to the switch unit 606 via the first resistor 605. Furthermore, the first setpoint value predefinition unit 505A is connected to a second resistor 600, which is in turn line-connected to the switch unit 606 and to a first capacitor 601. The switch unit 606 is in turn line-connected to the second capacitor 602. The second resistor 600 and the first capacitor 601 may define a higher cut-off frequency of the switchable low-pass filter, for example 20 Hz. By contrast, the second resistor 600, the first capacitor 601 and the second capacitor 602 may determine a lower cut-off frequency of the switchable low-pass filter 610, for example 0.5 Hz. Since DC sources are generally used, the setting of the summation current or the difference current may be made low-noise with such a low-pass filter. After the setting of the setpoint value by the first setpoint value predefinition unit 505A, during the change in the setpoint value (in some exemplary embodiments also shortly after the change in the setpoint value) the cut-off frequency of the switchable low-pass filter 610 is raised, for example to approximately 20 Hz. After an accelerated settling process, the cut-off frequency is lowered again, for example to approximately 0.5 Hz, in order to achieve a good noise quality. FIG. 26 shows a first operating mode of the switchable low-pass filter 610. In the first operating mode, the first capacitor 601 and the second capacitor 602 are connected in parallel with one another. In this case, the switchable low-pass filter 610 has the low cut-off frequency of 0.5 Hz. If the setpoint value of the summation current or difference current is then changed, the switchable low-pass filter 610 is switched during the change. The switch unit 606 is brought into the dashed position. The first capacitor 601 alone is then connected. The cut-off frequency of the switchable low-pass filter is 20 Hz. The charging circuit recharges the second capacitor 602, such that the voltages at the first capacitor 601 and at the second capacitor 602 are identical upon renewed switching of the switch unit 606. The renewed switching takes place after the charge reversal process of the first capacitor 601 by way of the second resistor 600 is concluded and no new setpoint value has been chosen. If a new setpoint value has been chosen, once again there is a wait during the charge reversal of the first capacitor 601. The first Zener diode 603 and the second Zener diode 604 are preferably provided. They serve for limiting the maximum charging current of the second capacitor 602. Furthermore, they prevent the operational amplifier 608 from being able to attain saturation. In further exemplary embodiments, the first Zener diode 603 and the second Zener diode 604 are not provided. The switch unit 606 is designed for example as an electronic relay. The voltage for the first current control operational amplifier 507A is tapped off at a first output terminal 607A and at a second output terminal 607B. Even during the switching process, the switchable low-pass filter 610 has no voltage jumps at the first output terminal 607A and at the second output terminal 607B and furthermore has no jumps in the output resistances of the first output terminal 607A and the second output terminal 607B. For this purpose, the operational amplifier has a small offset voltage for example in the range of less than or equal to 4 µV. The second capacitor 602 can be subjected to charge reversal in a time of a few seconds, such that the charge reversal process is concluded at a switching time.

A further exemplary embodiment provides for the second Zener diode 604 to be connected to the output of the power driver 609. In this case, the operational amplifier 608 and the power driver 609 may be integrated jointly for example in a power operational amplifier with a small offset or a precision operational amplifier with a sufficiently high output current (for example 30 mA).

The features of the invention disclosed in the present description, in the drawings and in the claims can be essential for the realization of the invention in the various embodiments thereof, both individually and in arbitrary combinations. The invention is not restricted to the described embodiments. It can be varied within the scope of the claims, taking into account the knowledge of the relevant person skilled in the art.

The invention claimed is:

1. A particle beam apparatus or analyzing and/or processing an object comprising
at least one beam generator for generating a particle beam with charged particles,
at least one beam deflection device for deflecting the particle beam, wherein the beam deflection device has at least one first coil and at least one second coil,
at least one circuit arrangement for providing a first coil current for the first coil and for providing a second coil current for the second coil, and comprising
at least one detector for detecting interaction particles and/or interaction radiation, wherein the interaction particles and/or the interaction radiation arise/arises due to an interaction of the particle beam with the object,
wherein
the circuit arrangement has a first circuit unit for providing the first coil current and a second circuit unit for providing the second coil current,
the first circuit unit has a first setpoint value predefinition unit for predefining a first value in the form of a summation current of the first coil current and the second coil current or for predefining a first value in the form of a difference current from the first coil current and the second coil current, the first circuit unit has a first current control unit, wherein the first current control unit is connected to the first setpoint value predefinition unit and to the first coil, the first circuit unit has a first measuring resistor for determining a first through-flow current by measuring a first voltage, wherein the first measuring resistor is connected to the first coil, the second circuit unit has a second setpoint value predefinition unit for predefining a second value of the second coil current, the second circuit unit has a second current control unit, wherein the second current control unit is connected to the second setpoint value predefinition unit and to the second coil, the second circuit unit has a second measuring resistor for determining a second through-flow current by measuring a second voltage, wherein the second measuring resistor is connected to the second coil, the first circuit unit has at least one summation-difference unit, wherein the summation-difference unit is connected to the first measuring resistor and the second measuring resistor in such a way that the summation-difference unit obtains the first voltage and the second voltage as input signals and outputs a summation signal or a difference signal as an output signal, and wherein the summation-difference unit is connected to the first current control unit in such a way that the output signal of the summation-difference unit serves as input signal for the first current control unit for controlling the first coil current in such a way that the first value is achieved.

2. The particle beam apparatus as claimed in claim 1, wherein
the first measuring resistor is designed as a first shunt resistor, and/or
the second measuring resistor is designed as a second shunt resistor.

3. The particle beam apparatus as claimed in claim 1, wherein the first measuring resistor and the second measuring resistor are arranged on an individual mounting unit in such a way that the first measuring resistor is thermally coupled to the second measuring resistor in such a way that a first thermal resistance of the first measuring resistor with respect to the second measuring resistor is less than a second thermal resistance of the first measuring resistor and/or the second measuring resistor with respect to an environment of the first measuring resistor and/or of the second measuring resistor.

4. The particle beam apparatus as claimed in claim 1, wherein
the second circuit unit has at least one difference unit, wherein the difference unit is connected to the second measuring resistor in such a way that the difference unit obtains the second voltage as an input signal and outputs a second difference signal as a second output signal, and wherein
the difference unit is connected to the second current control unit for controlling the second coil current.

5. The particle beam apparatus as claimed in claim 4, wherein the second current control unit has a second operational amplifier and is connected to the difference unit in such a way that the output signal of the difference unit is an input signal of the second operational amplifier.

6. The particle beam apparatus as claimed in claim 1, wherein at least one first preamplifier is connected between the first measuring resistor and the summation-difference unit.

7. The particle beam apparatus as claimed in claim 1, wherein at least one second preamplifier is connected between the second measuring resistor and the summation-difference unit.

8. The particle beam apparatus as claimed in claim 1, wherein the first current control unit has a first operational amplifier and is connected to the summation-difference unit in such a way that the output signal of the summation-difference unit is an input signal of the first operational amplifier.

9. The particle beam apparatus as claimed in claim 1, wherein the beam deflection device is designed as an objective lens for deflecting the particle beam onto the object.

10. The particle beam apparatus as claimed in claim 1, wherein the second current control unit is configured for controlling the second coil current in such a way that a power of the beam deflection device is constant.

11. The particle beam apparatus as claimed in claim 1, wherein the beam deflection device has at least one magnetic sector.

12. The particle beam apparatus as claimed in claim 1, wherein the circuit arrangement has a switchable low-pass filter having a charging circuit, wherein
the charging circuit has an operational amplifier, an amplifier, a first resistor, a second resistor, a first capacitor, a second capacitor and a switch unit,
the first setpoint value predefinition unit is line-connected to the operational amplifier,
the amplifier is connected to the switch unit via the first resistor,
the first setpoint value predefinition unit is connected to the second resistor,
the second resistor is line-connected to the switch unit and to the first capacitor, and wherein
the switch unit is line-connected to the second capacitor.

13. The particle beam apparatus as claimed in claim 12, wherein the charging circuit has at least one of the following features:
a first Zener diode and a second Zener diode, which are connected in series;
the switch unit has a switching setting in which the first capacitor and the second capacitor are connected in parallel with one another; or
the operational amplifier is line-connected to the amplifier, or the operational amplifier is integrated with the amplifier jointly in a power operational amplifier or in a precision operational amplifier.

14. A method for operating a particle beam apparatus including at least one beam generator for generating a particle beam with charged particles, at least one beam deflection device for deflecting the particle beam, the beam deflection device having at least one first coil and at least one second coil, and at least one circuit arrangement for providing a first coil current for the first coil and for providing a second coil current for the second coil, wherein the at least one circuit arrangement includes a first circuit unit for providing the first coil current, the first circuit unit including a first current control unit and a first measuring resistor for determining a first through-flow current by measuring a first voltage, the first measuring resistor connected to the first coil, wherein the at least one circuit arrangement includes a second circuit unit for providing the second coil current, the second circuit unit including a second measuring resistor for determining a second through-flow current by measuring a second voltage, the second measuring resistor connected to the second coil, wherein the first circuit unit has at least one summation-difference unit connected to the first measuring resistor and the second measuring resistor, and wherein the method comprises the following steps:
- predefining a first value in the form of a summation current of the first coil current and the second coil current or predefining the first value in the form of a difference current from the first coil current and the second coil current;
- predefining a second value of the second coil current;
- measuring the first voltage by means of the first measuring resistor;
- measuring the second voltage by means of the second measuring resistor;
- feeding the first voltage and the second voltage to the summation-difference unit;
- forming a sum of the first voltage and the second voltage and outputting the sum as an output signal of the summation-difference unit or forming a difference between the first voltage and the second voltage and outputting the difference as the output signal of the summation-difference unit;
- feeding the output signal of the summation-difference unit to the first current control unit as an input signal, and
- controlling the first coil current using the first current control unit in such a way that the first value is achieved.

15. The method as claimed in claim 14, wherein the method comprises the following step:
- controlling the second coil current in such a way that a power of the beam deflection device is constant.

16. The method as claimed in claim 14, wherein the second circuit unit includes a second current control unit, and wherein the method comprises the following steps:
- feeding the second voltage as an input signal to the difference unit;
- forming an output signal of the difference unit in the form of a difference signal;
- feeding the output signal to the second current control unit; and
- controlling the second coil current using the second current control unit in such a way that the second value is achieved.

17. The method as claimed in claim 14, wherein predefining the first value comprises the following steps:
- predefining a third value of the summation current, which is greater than the desired value of the summation current, or predefining a third value of the difference current, which is greater than the desired value of the difference current, in such a way that the third value of the summation current or the third value of the difference current is set in a ramplike fashion; and
- ending the setting upon reaching or shortly before reaching the desired first value.

18. The method as claimed in claim 14, wherein predefining the second value of the second coil current comprises the following steps:
- setting the second coil current to a fourth value, which is greater than the second value of the second coil current; and
- ending the setting of the second coil current upon reaching or shortly before reaching the second value.

19. The method as claim in claim 14, wherein:
- the first circuit unit has a first setpoint value predefinition unit for predefining the first value;
- the first current control unit is connected to the first setpoint value predefinition unit and to the first coil;
- the second circuit unit has a second setpoint value predefinition unit for predefining the second value of the second coil current;
- the second circuit unit has a second current control unit, wherein the second current control unit is connected to the second setpoint value predefinition unit and to the second coil;
- the summation-difference unit is connected to the first measuring resistor and the second measuring resistor in such a way that the summation-difference unit obtains the first voltage and the second voltage as input signals; and
- the summation-difference unit is connected to the first current control unit in such a way that the output signal of the summation-difference unit serves as the input signal for the first current control unit.

20. The method as claimed in claim 19, wherein the particle beam apparatus includes at least one detector for detecting interaction particles and/or interaction radiation, wherein the interaction particles and/or the interaction radiation arise/arises due to an interaction of the particle beam with the object.

* * * * *